(12) United States Patent
Yanagisawa et al.

(10) Patent No.: US 7,454,725 B2
(45) Date of Patent: Nov. 18, 2008

(54) APPARATUS AND COMPUTER READABLE MEDIUM HAVING PROGRAM FOR ANALYZING DISTRIBUTED CONSTANT IN A TRANSMISSION LINE

(75) Inventors: Koichi Yanagisawa, Ueda (JP); Fuchun Zhang, Ueda (JP); Toshiro Sato, Nagano (JP)

(73) Assignee: Hioki Denki Kabushiki Kaisha, Nagano-ken (JP)

( * ) Notice: Subject to any disclaimer, the term of this patent is extended or adjusted under 35 U.S.C. 154(b) by 860 days.

(21) Appl. No.: 10/883,832

(22) Filed: Jul. 6, 2004

(65) Prior Publication Data
US 2005/0010380 A1 Jan. 13, 2005

(30) Foreign Application Priority Data
Jul. 9, 2003 (JP) ............................. 2003-272599
Jan. 30, 2004 (JP) ............................. 2004-024124

(51) Int. Cl.
*G06F 17/50* (2006.01)

(52) U.S. Cl. ............................................ 716/5; 703/14

(58) Field of Classification Search ........................ None
See application file for complete search history.

(56) References Cited

U.S. PATENT DOCUMENTS
6,567,955 B1 * 5/2003 Yamaguchi .................... 716/4
2002/0147575 A1 * 10/2002 Bois et al. ..................... 703/14

OTHER PUBLICATIONS

Griffith et al., "State-Variable Simulation of Transients on Transmission Lines," 1989 IEEE, pp. 600-602.*
Nelms et al., "Simulation of Transmission Line Transients Using Personal Computer," 1988 IEEE, pp. 229-232.*
Tanji et al., "Passive Closed-Form Expression of RLCG Transmission Lines," 2002 IEEE, pp. 795-798.*

* cited by examiner

*Primary Examiner*—Leigh Marie Garbowski
(74) *Attorney, Agent, or Firm*—Manabu Kanesaka

(57) ABSTRACT

The invention is aimed to analyze the characteristics of a transmission line only by inputting the specific distributed parameters without mesh dividing the transmission line to be analyzed into minimal unit required for the analysis. An arithmetic operation section 12 solves a differential equation regarding electromagnetic interaction of each line segment based on the predetermined distributed parameters, including a distributed self-inductance $L_i$, a distributed resistance $R_i$, and a distributed capacitance $c_i$ and a distributed conductance $g_i$ in relation to a reference potential plane in the transmission line, and a distributed mutual inductance $M_{ij}$, a distributed capacitance $C_{ij}$, and a distributed conductance $G_{ij}$ between the transmission line and another transmission line, which are input from an input section 11, and calculates the characteristic data of the transmission line.

18 Claims, 9 Drawing Sheets

$$\begin{pmatrix} f_{vsp}(1) & f_{vsp}(2) & \cdots & f_{vsp}(2n) & f_{vsq}(1) & f_{vsq}(2) & \cdots & f_{vsq}(2n) \\ f_{vlp}(2,1) & f_{vlp}(2,2) & \cdots & f_{vlp}(2,2n) & f_{vlq}(2,1) & f_{vlq}(2,2) & \cdots & f_{vlq}(2,2n) \\ \vdots & \vdots & \ddots & \vdots & \vdots & \vdots & \ddots & \vdots \\ f_{vlp}(n,1) & f_{vlp}(n,2) & \cdots & f_{vlp}(n,2n) & f_{vlq}(n,1) & f_{vlq}(n,2) & \cdots & f_{vlq}(n,2n) \\ \hline f_{isp}(1) & f_{isp}(2) & \cdots & f_{isp}(2n) & f_{isq}(1) & f_{isq}(2) & \cdots & f_{isq}(2n) \\ f_{ilp}(2,1) & f_{ilp}(2,2) & \cdots & f_{ilp}(2,2n) & f_{ilq}(2,1) & f_{ilq}(2,2) & \cdots & f_{ilq}(2,2n) \\ \vdots & \vdots & \ddots & \vdots & \vdots & \vdots & \ddots & \vdots \\ f_{ilp}(n,1) & f_{ilp}(n,2) & \cdots & f_{ilp}(n,2n) & f_{ilq}(n,1) & f_{ilq}(n,2) & \cdots & f_{ilq}(n,2n) \\ \hline f_{ttp}(1) & f_{ttp}(2) & \cdots & f_{ttp}(2n) & f_{ttq}(1) & f_{ttq}(2) & \cdots & f_{ttq}(2n) \\ f_{vgp}(2,1) & f_{vgp}(2,2) & \cdots & f_{vgp}(2,2n) & f_{vgq}(2,1) & f_{vgq}(2,2) & \cdots & f_{vgq}(2,2n) \\ \vdots & \vdots & \ddots & \vdots & \vdots & \vdots & \ddots & \vdots \\ f_{vgp}(n,1) & f_{vgp}(n,2) & \cdots & f_{vgp}(n,2n) & f_{vgq}(n,1) & f_{vgq}(n,2) & \cdots & f_{vgq}(n,2n) \\ \hline f_{gtp}(1) & f_{gtp}(2) & \cdots & f_{gtp}(2n) & f_{gtq}(1) & f_{gtq}(2) & \cdots & f_{gtq}(2n) \\ f_{igp}(2,1) & f_{igp}(2,2) & \cdots & f_{igp}(2,2n) & f_{igq}(2,1) & f_{igq}(2,2) & \cdots & f_{igq}(2,2n) \\ \vdots & \vdots & \ddots & \vdots & \vdots & \vdots & \ddots & \vdots \\ f_{igp}(n,1) & f_{igp}(n,2) & \cdots & f_{igp}(n,2n) & f_{igq}(n,1) & f_{igq}(n,2) & \cdots & f_{igq}(n,2n) \end{pmatrix} \begin{pmatrix} p_1 \\ p_2 \\ \vdots \\ p_n \\ p_{n+1} \\ p_{n+2} \\ \vdots \\ p_{2n} \\ q_1 \\ q_2 \\ \vdots \\ q_n \\ q_{n+1} \\ q_{n+2} \\ \vdots \\ q_{2n} \end{pmatrix} = \begin{pmatrix} V_s \\ 0 \\ 0 \\ \vdots \\ 0 \\ \hline 0 \\ 0 \\ \vdots \\ 0 \\ \hline 0 \\ 0 \\ \vdots \\ 0 \\ \hline 0 \\ 0 \\ \vdots \\ 0 \end{pmatrix}$$

wherein
$$f_{vgp}(r', i) = f_{vlp}(n + r', i)$$
$$f_{igp}(r', i) = f_{ilp}(n + r', i)$$

Fig. 8

$$\begin{pmatrix} L_1 & & M_{13} & M_{24} & \cdots & M_{2,n} & M_{1,n+1} & M_{2,n+2} & M_{1,n+3} & M_{2,n+4} & \cdots & M_{2,2n} \\ M_{31} & L_2 & L_3 & M_{24} & & M_{2,n} & M_{3,n+1} & M_{2,n+2} & M_{3,n+3} & M_{4,n+4} & & M_{4,2n} \\ & M_{42} & & L_4 & & M_{4,n} & & M_{4,n+2} & & & & \\ \vdots & M_{n2} & \vdots & M_{n4} & \ddots & L_n & \vdots & M_{n,n+2} & & M_{n,n+4} & \ddots & M_{n,2n} \\ \hline M_{n+1,1} & & M_{n+1,3} & & \cdots & M_{2,n} & L_{n+1} & & M_{n+1,n+3} & & & \\ & M_{n+2,2} & & M_{n+2,4} & & M_{n+2,n} & & L_{n+2} & L_{n+3} & M_{n+2,n+4} & \cdots & M_{n+2,2n} \\ M_{n+3,1} & & M_{n+3,3} & & & & M_{n+3,n+1} & & L_{n+3} & & & \\ & M_{n+4,2} & & M_{n+4,4} & \cdots & M_{n+4,n} & & M_{n+4,n+2} & & L_{n+4} & \cdots & M_{n+4,2n} \\ \vdots & & \vdots & & & & \vdots & & \vdots & & & \\ & M_{2n,2} & & M_{2n,4} & \cdots & M_{2n,n} & & M_{2n,n+2} & & M_{2n,n+4} & \cdots & L_{2n} \end{pmatrix}$$

Fig. 9

$$\begin{pmatrix} c_1 & & & & \cdots & & c_{1,n+1} & c_{3,n+2} & & & \cdots & \\ & c_2 & & & & & & c_{2,n+2} & c_{3,n+3} & c_{4,n+3} & & \\ & & c_3 & & & & & & & c_{4,n+4} & & \\ & & & c_4 & & & & & & & & \\ \vdots & \vdots & \vdots & \vdots & \ddots & & \vdots & \vdots & \vdots & \vdots & & \\ & & & & & c_n & c_{n+1} & & & & & c_{n,2n} \\ \hline c_{n+1,1} & & & & \cdots & & c_{n+1} & & & & \cdots & \\ & c_{n+2,2} & & & & & & c_{n+2} & & & & \\ c_{n+3,1} & & c_{n+3,3} & & & & & & c_{n+3} & & & \\ & c_{n+4,2} & & c_{n+4,4} & & & & & & c_{n+4} & & \\ \vdots & \vdots & \vdots & \vdots & \ddots & & \vdots & \vdots & \vdots & \vdots & & \\ & & & & \cdots & c_{2n,n} & & & & & & c_{2n} \end{pmatrix}$$

Fig. 10

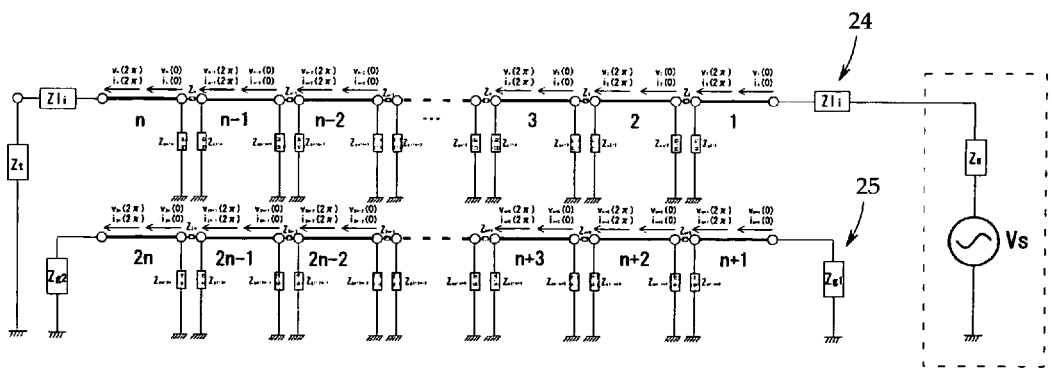

Fig. 11

$$\begin{pmatrix} f_{vsp}(1) & f_{vsp}(2) & \cdots & f_{vsp}(2n) & f_{vsq}(1) & f_{vsq}(2) & \cdots & f_{vsq}(2n) \\ f_{vlp}(2,1) & f_{vlp}(2,2) & \cdots & f_{vlp}(2,2n) & f_{vlq}(2,1) & f_{vlq}(2,2) & \cdots & f_{vlq}(2,2n) \\ \vdots & \vdots & \ddots & \vdots & \vdots & \vdots & \ddots & \vdots \\ f_{vlp}(n,1) & f_{vlp}(n,2) & \cdots & f_{vlp}(n,2n) & f_{vlq}(n,1) & f_{vlq}(n,2) & \cdots & f_{vlq}(n,2n) \\ \hline f_{isp}(1) & f_{isp}(2) & \cdots & f_{isp}(2n) & f_{isq}(1) & f_{isq}(2) & \cdots & f_{isq}(2n) \\ f_{ilp}(2,1) & f_{ilp}(2,2) & \cdots & f_{ilp}(2,2n) & f_{ilq}(2,1) & f_{ilq}(2,2) & \cdots & f_{ilq}(2,2n) \\ \vdots & \vdots & \ddots & \vdots & \vdots & \vdots & \ddots & \vdots \\ f_{ilp}(n,1) & f_{ilp}(n,2) & \cdots & f_{ilp}(n,2n) & f_{ilq}(n,1) & f_{ilq}(n,2) & \cdots & f_{ilq}(n,2n) \\ \hline f_{ttp}(1) & f_{ttp}(2) & \cdots & f_{ttp}(2n) & f_{ttq}(1) & f_{ttq}(2) & \cdots & f_{ttq}(2n) \\ f_{vgp}(2,1) & f_{vgp}(2,2) & \cdots & f_{vgp}(2,2n) & f_{vgq}(2,1) & f_{vgq}(2,2) & \cdots & f_{vgq}(2,2n) \\ \vdots & \vdots & \ddots & \vdots & \vdots & \vdots & \ddots & \vdots \\ f_{vgp}(n,1) & f_{vgp}(n,2) & \cdots & f_{vgp}(n,2n) & f_{vgq}(n,1) & f_{vgq}(n,2) & \cdots & f_{vgq}(n,2n) \\ \hline f_{gtp}(1) & f_{gtp}(2) & \cdots & f_{gtp}(2n) & f_{gtq}(1) & f_{gtq}(2) & \cdots & f_{gtq}(2n) \\ f_{igp}(2,1) & f_{igp}(2,2) & \cdots & f_{igp}(2,2n) & f_{igq}(2,1) & f_{igq}(2,2) & \cdots & f_{igq}(2,2n) \\ \vdots & \vdots & \ddots & \vdots & \vdots & \vdots & \ddots & \vdots \\ f_{igp}(n,1) & f_{igp}(n,2) & \cdots & f_{igp}(n,2n) & f_{igq}(n,1) & f_{igq}(n,2) & \cdots & f_{igq}(n,2n) \end{pmatrix} \begin{pmatrix} p_1 \\ p_2 \\ \vdots \\ p_n \\ p_{n+1} \\ p_{n+2} \\ \vdots \\ p_{2n} \\ q_1 \\ q_2 \\ \vdots \\ q_n \\ q_{n+1} \\ q_{n+2} \\ \vdots \\ q_{2n} \end{pmatrix} = \begin{pmatrix} V_s \\ 0 \\ 0 \\ \vdots \\ 0 \\ 0 \\ 0 \\ \vdots \\ 0 \\ 0 \\ 0 \\ \vdots \\ 0 \\ 0 \\ 0 \\ \vdots \\ 0 \end{pmatrix}$$

wherein
$$f_{vgp}(r', i) = f_{vlp}(n + r', i)$$
$$f_{igp}(r', i) = f_{ilp}(n + r', i)$$

Fig. 12

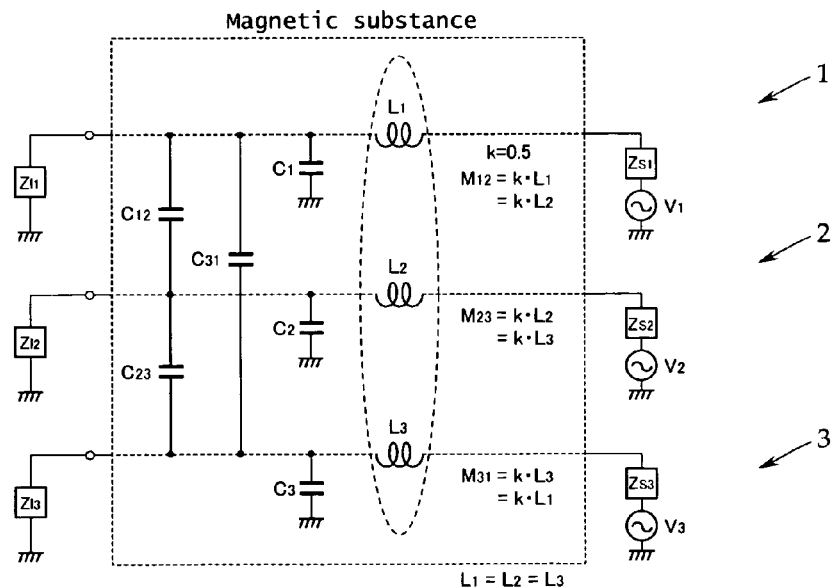

APPARATUS AND COMPUTER READABLE MEDIUM HAVING PROGRAM FOR ANALYZING DISTRIBUTED CONSTANT IN A TRANSMISSION LINE

TECHNICAL FIELD

The present invention relates to an apparatus for analyzing the distributed constant in a transmission line, and more particularly to an apparatus for analyzing the distributed constant, which is capable of analyzing the characteristics of the transmission line only by inputting the specific distributed parameters without mesh dividing the transmission line to be analyzed into minimal units required for the analysis. This apparatus for analyzing the distributed constant is especially suitable for a transmission line included in a spiral layered type distributed constant filter. This invention is also concerned with a program installed into an arithmetical operation section of the apparatus for analyzing the distributed constant.

BACKGROUND ART

Generally, a variety of high frequency devices are operable based on an electromagnetic interaction phenomenon described by the Maxwell's equation. Accordingly, a high frequency electromagnetic analysis is usually employed to analyze them. One of prior arts is well known as a design tool called Ansoft HFSS (High-Frequency Structure Simulator) developed by Ansoft Corp. in the United States.

This design tool developed by Ansoft Corp. is designed to involves automatically acquire the device characteristics of microwave, milliwave or wireless devices by solving the Maxwell's equation that is an operation principle for the high frequency devices, and can be used to determine the characteristics of antenna, transmission line, filter and connector by creating the shape of device to be analyzed using a three dimensional CAD interface, and setting up the material property values and an input/output port.

However, most of prior arts including the design tool developed by Ansoft Corp. make use of a Finite Element Method (FEM), and have the following problem:

In the Finite Element Method, the object having actually a complex shape and property is mesh divided into minimal units having a simple shape and property. Then, the characteristics of each element are approximately represented using a mathematical equation, and the simple equations are combined and solved simultaneously to predict the overall characteristics.

Therefore, the structure of an object to be analyzed must be mesh divided into simple minimal units required for the analysis, the units must be input into the three dimensional CAD, and the material property values for individual meshes must be specified. The procedure is time and labor intensive. Besides, the arithmetical operation spent several minutes to several hours in a super-computer class, and several days to several months in a workstation class, for example.

Accordingly, it is an object of the present invention to provide an apparatus and method for analyzing the distributed constant a transmission line to analyze the characteristics of the transmission line only by inputting the specific distributed parameters without mesh dividing the transmission line to be analyzed into minimal units required for the analysis, especially suitable for the transmission line included in a spiral layered type distributed constant filter.

SUMMARY OF THE INVENTION

In order to accomplish the above object, the present invention of the first aspect provides an apparatus for analyzing the distributed constant in a transmission line, comprising an input section for inputting the distributed parameters for each line segment virtually and arbitrarily divided in the transmission line to be analyzed, an arithmetic operation section for calculating the characteristic data of the transmission line by performing a predetermined arithmetic operation based on the distributed parameters input from the input section, and an output section for outputting the characteristic data, wherein the distributed parameters input from the input section include a distributed self-inductance $L_i$, a distributed resistance $R_i$, and a distributed capacitance $c_i$ and a distributed conductance $g_i$ in relation to a reference potential plane in the transmission line, and a distributed mutual inductance $M_{ij}$, a distributed capacitance $C_{ij}$, and a distributed conductance $G_{ij}$ between the transmission line and another transmission line, wherein the arithmetic operation section calculates the characteristic data in the transmission line by solving a differential equation regarding electromagnetic interaction of the line segment based on the predetermined distributed parameters.

In the invention of the second aspect, the arithmetic operation section comprises the secondary simultaneous differential equations as represented in the following formula 1 regarding electromagnetic interaction of the line segment with the voltage $V(\theta)$ each line segment in the transmission line as an unknown variable (in the formula 1, $V(\theta)$ is a column vector of n×1 as represented in the following formula 2, Z is an impedance matrix created based on the distributed parameters as represented in the following formula 3, Y is an admittance matrix created based on the distributed parameters as represented in the following formula 4), in which the secondary simultaneous differential equations as represented in the formula 1 are solved by obtaining the eigenvalues $\gamma_i^2$ (i=1 to n: n is the virtually divided number of line segments) of a complex coefficient matrix $-ZY$ with the impedance matrix Z and the admittance matrix Y, thereby acquiring a general solution ($p_i$, $q_i$ are arbitrary constants, and $u_i$ (i=1 to n) are eigenvectors corresponding to the eigenvalues $\gamma_i^2$) of voltage and current as represented in the following formula 5 and the following formula 6a or 6b at a limited position on the line segment.

$$\frac{d^2}{d\theta^2} V(\theta) = -ZY \cdot V(\theta) \quad \text{(Formula 1)}$$

$$V(\theta) = \begin{pmatrix} v_1(\theta) \\ v_2(\theta) \\ \vdots \\ v_n(\theta) \end{pmatrix} \quad \text{(Formula 2)}$$

$$Z = \begin{pmatrix} (R_1 + j\omega L_1) & j\omega M_{12} & \cdots & j\omega M_{1n} \\ j\omega M_{21} & (R_2 + j\omega L_2) & \cdots & j\omega M_{2n} \\ \vdots & \vdots & \ddots & \vdots \\ j\omega M_{n1} & j\omega M_{n2} & \cdots & (R_n + j\omega L_n) \end{pmatrix} \quad \text{(Formula 3)}$$

$$Y = \begin{pmatrix} \xi_1 & (G_{12} + j\omega C_{12}) & \cdots & (G_{1n} + j\omega C_{1n}) \\ (G_{21} + j\omega C_{21}) & \xi_2 & \cdots & (G_{2n} + j\omega C_{2n}) \\ \vdots & \vdots & \ddots & \vdots \\ (G_{n1} + j\omega C_{n1}) & (G_{n2} + j\omega C_{n2}) & \cdots & \xi_n \end{pmatrix} \quad \text{(Formula 4)}$$

wherein, $$\xi_i = -\left\{ (g_j + j\omega c_j) + \sum_{k=1, k \neq j}^{n} (G_{jk} + j\omega C_{jk}) \right\} \quad \text{(Formula 5)}$$

$$V(\theta) = \sum_{i=1}^{n} (p_i \cosh(\gamma_i \theta) + q_i \sinh(\gamma_i \theta)) u_i$$

-continued $$I(\theta) = Y \int_n V(\theta) d\theta \quad \text{(Formula 6a)}$$

$$= Y \sum_{i=1}^{n} \frac{1}{\gamma_i} \{p_i \sinh(\gamma_i \theta) + q_i \cosh(\gamma_i \theta)\} u_1 \text{ or,}$$

$$I(\theta) = -Z^{-1} \sum_{i=1}^{n} \gamma_i \{p_i \sinh(\gamma_i \theta) + q_i \cosh(\gamma_i \theta)\} d\theta \quad \text{(Formula 6b)}$$

In the invention of the third aspect, the arithmetic operation section further calculates arbitrary constants (unknown variables) $p_i$, $q_i$ (i=1 to n) included in the general solution of voltage and current as represented in the formula 5 and the formula 6 a or 6b under the boundary conditions of the line segment that are input from the input section.

In the invention of the fourth aspect, the arithmetic operation section solves the secondary simultaneous differential equations as represented in the following formula 7 regarding electromagnetic interaction of the line segment with the current $I(\theta)$ of each line segment in the transmission line as an unknown variable, instead of the secondary simultaneous differential equations as represented in the formula 1, thereby acquiring a general solution of voltage and current as represented in the following formula 8 and the following formula 9a or 9b at a limited position on the line segment.

$$\frac{d^2}{d\theta^2} I(\theta) = -YZ \cdot I(\theta) \quad \text{(Formula 7)}$$

$$I(\theta) = \sum_{i=1}^{n} (p_i \cosh(\gamma_i \theta) + q_i \sinh(\gamma_i \theta)) u_i \quad \text{(Formula 8)}$$

$$V(\theta) = -Z \int_n I(\theta) d\theta \quad \text{(Formula 9a)}$$

$$= -Z \sum_{i=1}^{n} \frac{1}{\gamma_i} \{p_i \sinh(\gamma_i \theta) + q_i \cosh(\gamma_i \theta)\} u_1 \text{ OR,}$$

$$V(\theta) = -Z^{-1} \sum_{i=1}^{n} \gamma_i \{p_i \sinh(\gamma_i \theta) + q_i \cosh(\gamma_i \theta)\} u_i \quad \text{(Formula 9b)}$$

In the invention of the fifth aspect, the arithmetic operation section comprises the linearly simultaneous differential equations as represented in the following formula 10 regarding electromagnetic interaction of the line segment with the voltage $V(\theta)$ and current $I(\theta)$ of each line segment in the transmission line as unknown variables (in the formula 10, $W(\theta)$ is a matrix containing $V(\theta)_{n\times 1}$ and $I(\theta)_{n\times 1}$ as represented in the following formula 11, A is a matrix as represented in the following formula 12 containing the impedance matrix Z created based on the distributed parameters as represented in the formula 3 and the admittance matrix Y created based on the distributed parameters as represented in the formula 4), in which the linearly simultaneous differential equations as represented in the formula 10 are solved by obtaining 2n eigenvalues $\gamma_i^2$ (i=1 to 2n) of the matrix A, thereby acquiring a general solution ($\alpha_i$(i=1 to 2n) are arbitrary constants, and $u_i$ (i=1 to 2n) are eigenvectors corresponding to the eigenvalues $\gamma_i$) of voltage and current as represented in the following formula 13.

$$\frac{d}{d\theta} W(\theta) = A \cdot W(\theta) \quad \text{(Formula 10)}$$

$$W(\theta) = \begin{pmatrix} V(\theta)_{n\times 1} \\ I(\theta)_{n\times 1} \end{pmatrix} = \begin{pmatrix} v_1(\theta) \\ v_2(\theta) \\ \vdots \\ v_n(\theta) \\ i_1(\theta) \\ i_2(\theta) \\ \vdots \\ i_n(\theta) \end{pmatrix} \quad \text{(Formula 11)}$$

$$A = \begin{pmatrix} O_{n\times n} & -Z \\ Y & O_{n\times n} \end{pmatrix}_{2n\times 2n} \quad \text{(Formula 12)}$$

$$W(\theta) = \sum_{i=1}^{2n} a_i e^{\gamma_i \theta} u_i \quad \text{(Formula 13)}$$

In the invention of the sixth aspect, the arithmetic operation section sets up 2n simultaneous equations under the boundary conditions of the line segment input from the input section for each of the j-th (j=1 to n) components of a voltage vector as represented in the following formula 14 and a current vector as represented in the following formula 15 in the transmission line, which are derived from the general solution as represented in the formula 13 thereby acquiring 2n arbitrary constants (unknown variables) $\gamma_i$.

$$v_j(\theta) = \sum_{i=1}^{2n} \alpha_i e^{\gamma_i \theta} u_{ji} \quad \text{(Formula 14)}$$

$$i_j(\theta) = \sum_{i=1}^{2n} \alpha_i e^{\gamma_i \theta} u_{n+ji} \quad \text{(Formula 15)}$$

In the invention of the seventh aspect, the arithmetic operation section calculates an input/output voltage gain $A_v$ from an input voltage and a terminating voltage of the signal line after obtaining the arbitrary constants of the general solution regarding the voltage and current.

In the invention of the eighth aspect, the arithmetic operation section calculates an input impedance $Z_{in}$ of the signal line based on a signal source voltage $V_s$ and a signal source output impedance $Z_s$ included in the boundary conditions given from the input section after obtaining the arbitrary constants of the general solution regarding the voltage and current.

In the invention of the ninth aspect, the arithmetic operation section calculates an input/output voltage gain $A_v$ from an input voltage and a terminating voltage of the signal line after obtaining the arbitrary constants of the general solution regarding the voltage and current, and calculates an input impedance $Z_{in}$ of the signal line based on a signal source voltage $V_s$ and a signal source output impedance $Z_s$ included in the boundary conditions given from the input section, thereby acquiring an S parameter $S_{11}$ from the signal source output impedance $Z_s$ and the input impedance $Z_{in}$, and an S parameter $S_{21}$ from the S parameter $S_{11}$ and the input/output voltage gain $A_v$.

Also, in the invention of the tenth aspect, the signal line is involved in the equipment such as a connector, a sensor or a filter to allow the distributed constant characteristics of the equipment itself to be analyzed.

As defined in the eleventh aspect, the secondary simultaneous differential equations with the voltage $V(\theta)$ of each line segment as an unknown variable as represented in the formula 1 in claim 2 may be solved under the boundary conditions regarding the voltage of the line segment given from the input section in accordance with a numerical solution algorithm of the differential equation.

Similarly, as defined in the twelfth aspect, the secondary simultaneous differential equations with the current $I(\theta)$ of each line segment as an unknown variable as represented in the formula 7 in claim 4 may be solved under the boundary conditions regarding the current of the line segment given from the input section in accordance with a numerical solution algorithm of the differential equation.

Similarly, as defined in the thirteenth aspect, the linearly simultaneous differential equations with the voltage $V(\theta)$ and current $I(\theta)$ of each line segment as unknown variables as represented in the formula 10 in claim 5 may be solved under the boundary conditions regarding the voltage and current of the line segment given from the input section in accordance with a numerical solution algorithm of the differential equation.

In this invention as defined in the fourteenth aspect, the numerical solution algorithm is preferably any one of the Runge-Kutta methods, Shooting methods (Gun methods), and Relaxation methods.

Also, this invention comprises a program according to the fifteenth aspect for executing the second aspect, a program according to the sixteenth aspect for executing the third aspect, a program according to the seventeenth aspect for executing the fourth aspect, a program according to the eighteenth aspect for executing the fifth aspect, and a program according to the nineteenth aspect for executing the sixth aspect.

Each of those programs is installed into the arithmetic operation section consisting of a computer, although its medium is not specifically limited. The program may be provided in a recording medium such as FD or CD-ROM, or downloaded via a communication line such as the Internet.

According to this invention, it is possible to analyze the transmission line characteristics only by inputting at least the distributed self-inductance $L_i$, the distributed resistance $R_i$, and the distributed capacitance $c_i$ and the distributed conductance $g_i$ in relation to the reference potential plane in the transmission line, and the distributed mutual inductance $M_{ij}$, the distributed capacitance $C_{ij}$, and the distributed conductance $G_{ij}$ between the transmission line and another transmission line, as the distributed parameters for the transmission line to be analyzed, together with the predetermined boundary conditions of the transmission line, without mesh dividing the transmission line to be analyzed as in the Finite Element Method.

BRIEF DESCRIPTION OF THE DRAWINGS

FIG. 8 is a matrix diagram showing a magnetic coupling state between lines in the spiral layered type distributed constant device, when the length of one line segment is different;

FIG. 9 is a matrix diagram showing a capacitive coupling state between lines in the spiral layered type distributed constant device, when the length of one line segment is different;

FIG. 10 is a model circuit diagram that is simplified from the equivalent circuit diagram of FIG. 5;

FIG. 11 is a matrix diagram showing the simultaneous equations for deciding the unknown variables included in a general solution of a differential equation;

FIG. 12 is an equivalent circuit diagram of parallel three lines showing a specific analysis example of the invention;

DETAILED DESCRIPTION

Figure 1:
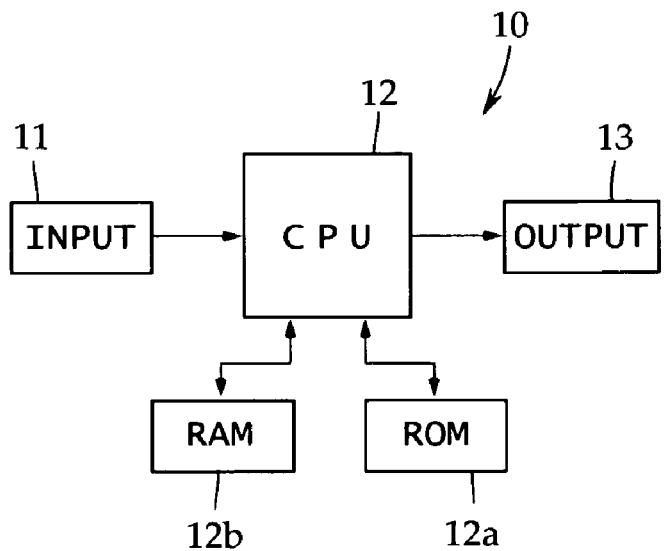
FIG. 1 is a block diagram showing a fundamental configuration of an apparatus for analyzing the distributed constant in a transmission line according to the present invention.

First of all, an apparatus 10 for analyzing the distributed constant in a transmission line has a fundamental configuration of comprising an input section 11, an arithmetic operation section 12 and an output section 13, as shown in FIG. 1. The input section 11 may be a keyboard. The distributed parameters of the transmission line to be analyzed, including a distributed self-inductance $L_i(H)$, a distributed resistance $R_i(\Omega)$, and a distributed capacitance $c_i(F)$ and a distributed conductance $g_i(S)$ in relation to a reference potential plane in the transmission line, and a distributed mutual inductance $M_{ij}(H)$, a distributed capacitance $C_{ij}(F)$, and a distributed conductance $G_{ij}(S)$ between the transmission line and another transmission line, are input from the input section 11. Each of the distributed parameters is a complex number, except for the distributed resistance and the distributed conductance. The unit is in a unit system in which the line length is defined.

The arithmetic operation section 12 has a ROM 12a and a working RAM 12b, and the ROM 12a stores a table for creating the differential equation or determinant. The arithmetic ability may be equal to or higher than that of the class of a personal computer commercially available on the market. The output section 13 may be preferably a color display or printer, and is connected to an external storage unit such as FD or CD-ROM, as needed.

Figure 2:
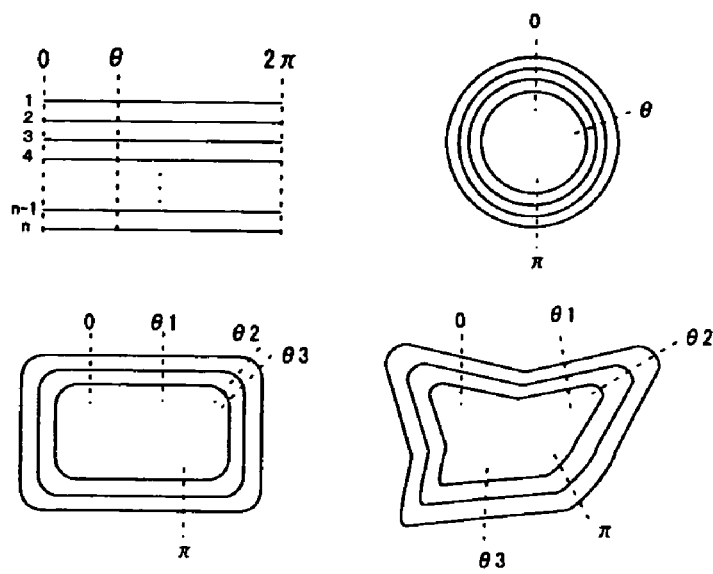
FIG. 2 is an explanatory view for defining a line segment in a relation with each pattern of the transmission line to be analyzed.

This invention is applicable to most of the transmission lines, but in the case of a spiral transmission line as shown in FIG. 2, each turn has a different length, and a different line position for electromagnetic coupling, unlike a linear parallel distributed constant line.

Figure 4A:
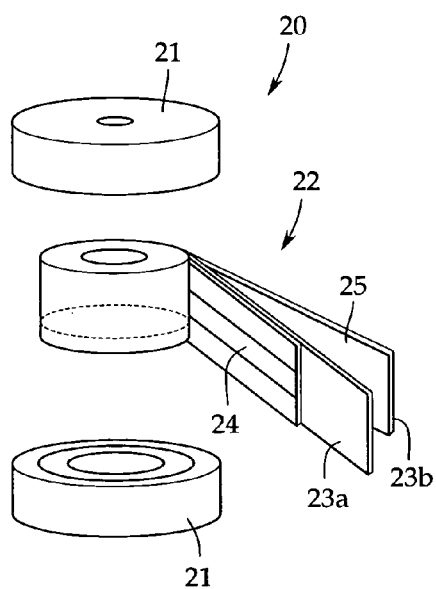
FIG. 4A is an exploded perspective view schematically showing a spiral layered type distributed constant device (filter) as analysis object.
Figure 4B:
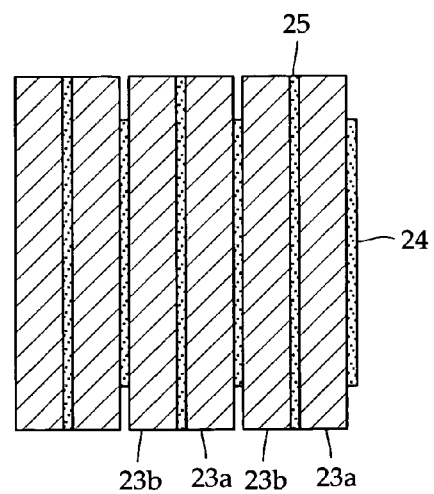
FIG. 4B is an enlarged cross-sectional view of the essence of the spiral layered type distributed constant device.

Therefore, variable θ is used as the parameter. A variable range of θ is arbitrarily set. However, in a spiral layered type distributed constant device (filter) having the transmission line wound as shown in FIGS. 4A and 4B, due to the reasons that the line is electromagnetically coupled with another line for each turn and the distributed parameters are difficult to display in a non-dimensional number, it is assumed that the start point for each turn is 0 [rad] and the end point is 2π [rad] in the following.

When the start and end points are defined as above, the relation of coupling position is correctly kept by taking θ at right angles to the line in any shape of a parallel coupled line, a spiral line, a rectangular line and a heteromorphic loop line, as shown in FIG. 2. Accordingly, in the case of a concentric circle (approximately spiral), θ is the angle of the start point as seen from the center.

Figure 3:
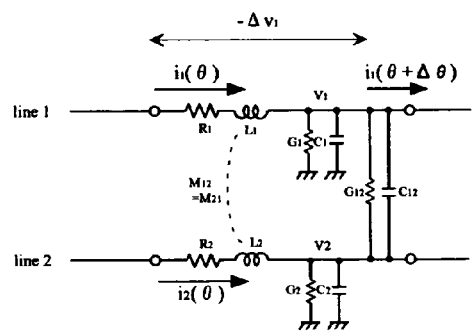
FIG. 3 is an equivalent circuit showing the distributed parameters that exist between two lines.

FIG. 3 shows a coupling distributed constant line including two lines 1 and 2. Referring to FIG. 3, a differential equation of distributed constant line will be described below. A voltage drop $\Delta v_i$ with $\Delta \theta$ on line 1 is caused by a resistance $R_1$ and a component of a self-inductance $L_1$ on the line itself and an induced voltage on the line 2, and represented by the following formula 100.

$$\Delta v_1 = -(R_1 + j\omega L_1)\Delta\theta i_1 - j\omega M_{12}\Delta\theta i_2 \qquad \text{(Formula 100)}$$

Both sides of the formula 100 are divided by $\Delta\theta$. Then, if $\Delta\theta$ goes to 0, the following formula 101 results.

$$\frac{dv_1}{d\theta} = -(R_1 + j\omega L_1)i_1 - j\omega M_{12}i_2 \qquad \text{(Formula 101)}$$

The following formula 102 holds for the line 2 due to symmetry.

$$\frac{dv_2}{d\theta} = -j\omega M_{21}i_1 - (R_2 + j\omega L_2)i_2 \qquad \text{(Formula 102)}$$

On the analogy from this result, if the voltage (potential, if seen from the reference plane) is represented by a function of position θ alone for n coupling distributed constant lines, the following formula 103 holds.

$$\frac{d}{d\theta}V(\theta) = -Z \cdot I(\theta) \qquad \text{(Formula 103)}$$

Where V(θ) in the formula 103 is represented by the following formula 104, I(θ) is represented by the following formula 105, and Z is an impedance matrix that is a square matrix (here, $M_{ij}=M_{ji}$) represented by the following formula 106.

$$V(\theta) = \begin{pmatrix} v_1(\theta) \\ v_2(\theta) \\ \vdots \\ v_n(\theta) \end{pmatrix} \qquad \text{(Formula 104)}$$

-continued $$I(\theta) = \begin{pmatrix} i_1(\theta) \\ i_2(\theta) \\ \vdots \\ i_n(\theta) \end{pmatrix} \qquad \text{(Formula 105)}$$

$$Z = \begin{pmatrix} (R_1 + j\omega L_1) & j\omega M_{12} & \cdots & j\omega M_{1n} \\ j\omega M_{21} & (R_2 + j\omega L_2) & \cdots & j\omega M_{2n} \\ \vdots & \vdots & \ddots & \vdots \\ j\omega M_{n1} & j\omega M_{n2} & \cdots & (R_n + j\omega L_n) \end{pmatrix} \qquad \text{(Formula 106)}$$

Then, a differential equation in view of the capacity between lines is derived. Firstly, the following formula 107 holds for i, like the differential equation regarding the voltage.

$$-\Delta i_1(\theta) = (G_1 + j\omega C_1)\Delta\theta \cdot v_1(\theta) \qquad \text{(Formula 107)}$$
$$+ (G_{12} + j\omega C_{12})\Delta\theta \cdot (v_1(\theta) - v_2(\theta))$$
$$+ (G_{13} + j\omega C_{13})\Delta\theta \cdot (v_1(\theta) - v_3(\theta))$$
$$\vdots$$
$$+ (G_{1n} + j\omega C_{1n})\Delta\theta \cdot (v_1(\theta) - v_n(\theta))$$

In this formula 107, the first term is a leak current for the GND (ground), and the second term is a leak current due to a potential difference between line 1 and line 2 (hereinafter referred to as a leak current between adjacent lines). Where $G_{12}, G_{13}, \ldots G_{1n}$ are conductance [S/rad] between lines, and $C_{12}, C_{13}, \ldots C_{1n}$ are capacity [F/rad] between lines ($G_{ij}=G_{ji}$, $C_{ij}=C_{ji}$). If this equation is represented in terms of the voltage for each line, the following formula 108 results.

$$-\Delta i_1(\theta) = \qquad \text{(Formula 108)}$$
$$\left\{(G_1 + j\omega C_1) + \sum_{k=2}^{n}(G_{1k} + j\omega C_{1k})\right\}\Delta\theta \cdot v_1(\theta) -$$
$$\sum_{k=2}^{n}(G_{1k} + j\omega C_{1k})\Delta\theta \cdot v_k(\theta)$$

Accordingly, both sides of the formula 108 are divided by $-\Delta\theta$, and if $\Delta\theta$ goes to 0, the equation for each transmission line is generalized in the form of simultaneous equations, whereby the following formula 109 results. Where Y in the formula is an admittance matrix represented by the following formula 110 and $\xi_j$ in the matrix Y is represented by the following formula 111.

$$\frac{d}{d\theta}I(\theta) = Y \cdot V(\theta) \qquad \text{(Formula 109)}$$

$$Y = \begin{pmatrix} \xi_1 & (G_{12} + j\omega C_{12}) & \cdots & (G_{1n} + j\omega C_{1n}) \\ (G_{21} + j\omega C_{21}) & \xi_2 & \cdots & (G_{2n} + j\omega C_{2n}) \\ \vdots & \vdots & \ddots & \vdots \\ (G_{n1} + j\omega C_{n1}) & (G_{12} + j\omega C_{n2}) & \cdots & \xi_n \end{pmatrix} \qquad \text{(Formula 110)}$$

$$\xi_j = -\left\{(g_j + j\omega c_j) + \sum_{k=1, k\neq j}^{n}(G_{jk} + j\omega C_{jk})\right\} \qquad \text{(Formula 111)}$$

The formula 103 is differentiated by θ and substituted for the formula 109, the secondary simultaneous differential equations for the parallel coupling distributed constant line represented by the following formula 112 (corresponding to formula 1 in claim 2) is obtained.

$$\frac{d^2}{d\theta^2}V(\theta) = -Z \cdot \frac{d}{d\theta}I(\theta) \quad \text{(Formula 112)}$$
$$= -ZY \cdot V(\theta)$$

The secondary simultaneous differential equations are solved by obtaining n eigenvalues $\gamma_i^2$ (i=1 to n) of a complex coefficient matrix $-ZY$. The result is represented by the following formula 113 (in this formula, $u_i$ (i=1 to n) are eigenvectors corresponding to eigenvalues $\gamma_i^2$).

$$V(\theta) = \quad \text{(Formula 113)}$$
$$(\alpha_1 e^{+\gamma_1 \theta} + \beta_1 e^{-\gamma_1 \theta})u_1 + (\alpha_2 e^{+\gamma_2 \theta} + \beta_2 e^{-\gamma_2 \theta})u_2 + \ldots +$$
$$(\alpha_n e^{+\gamma_n \theta} + \beta_n e^{-\gamma_n \theta})u_n = \sum_{i=1}^{n}(\alpha_i e^{+\gamma_i \theta} + \beta_i e^{-\gamma_i \theta})u_i$$

Moreover, substituting $\alpha_i + \beta_i = p_i$, $\alpha_i - \beta_i = q_i$ (p, q are arbitrary constants), this formula becomes an equation regarding the voltage using a hyperbolic function as represented by the following formula 114.

$$V(\theta) = \sum_{i=1}^{n}\left(p_i \frac{e^{+\gamma_i \theta} + e^{-\gamma_i \theta}}{2} + q_i \frac{e^{+\gamma_i \theta} - e^{-\gamma_i \theta}}{2}\right)u_i \quad \text{(Formula 114)}$$
$$= \underline{\sum_{i=1}^{n}(p_i \cosh(\gamma_i \theta) + q_i \sinh(\gamma_i \theta))u_i}_{n \times 1 \text{ row vector}}$$

On the other hand, as an equation regarding the current, the following equation 115 is obtained from the formula 103.

$$I(\theta) = -Z^{-1}\frac{d}{d\theta}V(\theta) \quad \text{(Formula 115)}$$
$$= -Z^{-1}\frac{d}{d\theta}\left\{\sum_{i=1}^{n}(p_i \cosh(\gamma_i \theta) + q_i \sinh(\gamma_i \theta))u_i\right\}$$
$$= -Z^{-1}\sum_{i=1}^{n}\gamma_i\{p_i \sinh(\gamma_i \theta) + q_i \cosh(\gamma_i \theta)\}u_i$$

If the formula 109 regarding the current is indefinitely integrated, the following formula 116 equivalent to the formula 115 is obtained. Supposing that the current has no bias (DC) component, the integration constant is omitted.

$$I(\theta) = Y\int V(\theta)d\theta \quad \text{(Formula 116)}$$
$$= Y\int \sum_{i=1}^{n}(p_i \cosh(\gamma_i \theta) + q_i \sinh(\gamma_i \theta))u_i dx$$
$$= Y\sum_{i=1}^{n}\left\{p_i \frac{1}{\gamma_i}\sinh(\gamma_i \theta) + q_i \frac{1}{\gamma_i}\cosh(\gamma_i \theta)\right\}u_i$$
$$= Y\sum_{i=1}^{n}\frac{1}{\gamma_i}\{p_i \sinh(\gamma_i \theta) + q_i \cosh(\gamma_i \theta)\}u_i$$

In this way, the secondary simultaneous differential equations of the formula 112 are solved to obtain a general solution for voltage and current as represented by the formulas 114 and 116. Accordingly, the j-th components of voltage and current vectors in the transmission line are represented by the following formulas 117 and 118. Using these formulas, 2n simultaneous equations are constructed under the boundary conditions to decide arbitrary constants (unknown variables) $p_i$, $q_i$. Where $\Psi(i,j)$ in the formula 118 is given by the formula 119, and $u_{ji}$ denotes the j-th element of the i-th eigenvector (n×1).

$$v_j(\theta) = \sum_{i=1}^{n}\cosh(\gamma_i \theta)u_{ji} \cdot p_i + \sum_{i=1}^{n}\sinh(\gamma_i \theta)u_{ji} \cdot q_i \quad \text{(Formula 117)}$$

$$i_j(\theta) = \sum_{i=1}^{n}\Psi(i, j)\sinh(\gamma_i \theta) \cdot p_i + \sum_{i=1}^{n}\Psi(i, j)\cosh(\gamma_i \theta) \cdot q_i \quad \text{(Formula 118)}$$

$$\Psi(i, j) = \frac{1}{\gamma_i}\sum_{k=1}^{n}y_{jk}u_{ki} \quad \text{(Formula 119)}$$

In another form, the secondary simultaneous differential equations for the parallel coupling distributed constant line regarding the current may be constructed, using the vectors $V(\theta)$, $I(\theta)$ and the complex number matrixes Z and Y that are used in a secondary simultaneous differential equation model for the above formula 112 regarding the voltage (potential). These secondary simultaneous differential equations are shown in the following formula 120 (corresponding to the formula 7 in claim 4).

$$\frac{d^2}{d\theta^2}I(\theta) = -YZ \cdot I(\theta) \quad \text{(Formula 120)}$$

This equation, which has the same form as the formula 112, is solved by obtaining n eigenvalues $\gamma_i^2$ (i=1 to n) for $-YZ$. The result is shown in the formula 121 ($u_i$ (i=1 to n) are eigenvectors corresponding to the eigenvalues $\gamma_i^2$, and $p_i$, $q_i$ are arbitrary constants). At this time, the voltage is represented by the formula 122.

$$I(\theta) = \sum_{i=1}^{n}(p_i \cosh(\gamma_i \theta) + q_i \sinh(\gamma_i \theta))u_i \quad \text{(Formula 121)}$$

$$V(\theta) = -Z\int I(\theta)d\theta \quad \text{(Formula 122)}$$
$$= -Z\sum_{i=1}^{n}\frac{1}{\gamma_i}\{p_i \sinh(\gamma_i \theta) + q_i \cosh(\gamma_i \theta)\}u_i$$

Accordingly, the j-th components of voltage and current vectors in the transmission line are represented by the following formulas 123 and 124. Where $\Psi(i,j)$ in the formula 124 is given by the formula 125, and $u_{ji}$ denotes the j-th element of the i-th eigenvector (n×1).

$$i_j(\theta) = \sum_{i=1}^{n}\cosh(\gamma_i \theta)u_{ji} \cdot p_i + \sum_{i=1}^{n}\sinh(\gamma_i \theta)u_{ji} \cdot q_i \quad \text{(Formula 123)}$$

$$v_j(\theta) = \sum_{i=1}^{n}\Psi(i, j)\sinh(\gamma_i \theta) \cdot p_i + \sum_{i=1}^{n}\Psi(i, j)\cosh(\gamma_i \theta) \cdot q_i \quad \text{(Formula 124)}$$

$$\Psi(i, j) = -\frac{1}{\gamma_i}\sum_{k=1}^{n}z_{jk}u_{ki} \quad \text{(Formula 125)}$$

In still another form, the linearly simultaneous differential equations for the parallel coupling distributed constant line may be constructed, using the vectors $V(\theta)$, $I(\theta)$ and the complex number matrices ZY that are used in the secondary simultaneous differential equation model. The linearly simultaneous differential equations are shown in the following formula 126.

$$\frac{d}{d\theta}W(\theta) = A \cdot W(\theta) \qquad \text{(Formula 126)}$$

A vector $W(\theta)$ included in the formula 126 is represented by the following formula 127, and A is a matrix as represented by the following formula 128.

$$W(\theta) = \begin{pmatrix} V(\theta)_{n\times 1} \\ I(\theta)_{n\times 1} \end{pmatrix} = \begin{pmatrix} v_1(\theta) \\ v_2(\theta) \\ \vdots \\ v_n(\theta) \\ i_1(\theta) \\ i_2(\theta) \\ \vdots \\ i_n(\theta) \end{pmatrix} \qquad \text{(Formula 127)}$$

$$A = \begin{pmatrix} 0_{n\times n} & -Z \\ Y & 0_{n\times n} \end{pmatrix}_{2n\times 2n} \qquad \text{(Formula 128)}$$

The linearly simultaneous differential equation of the formula 126 is solved by obtaining n eigenvalues $\gamma_i$ (i=1 to 2n) for the matrix A to obtain a general solution for the voltage and current as represented by the following formula 129 ($u_i$ (i=1 to 2n) are eigenvectors corresponding to the eigenvalues $\gamma_i$, and $\alpha_i$ (i=1 to 2n) are arbitrary constants).

$$W(\theta) = \sum_{i=1}^{2n} \alpha_i e^{\gamma_i\theta} u_i \qquad \text{(Formula 129)}$$

In this case, because 2n eigenvalues and eigenvectors must be obtained from 2n×2n matrix, the arithmetic operation amount is greater than solving the secondary simultaneous differential equations. However, the j-th components of voltage and current vectors in the transmission line are represented by the following formulas 130 and 131. Using these formulas, 2n simultaneous equations are constructed under the boundary conditions to decide 2n arbitrary constants (unknown variables) $\alpha_i$.

$$v_j(\theta) = \sum_{i=1}^{2n} \alpha_i e^{\gamma_i\theta} u_{ji} \qquad \text{(Formula 130)}$$

$$i_j(\theta) = \sum_{i=1}^{2n} \alpha_i e^{\gamma_i\theta} u_{n+ji} \quad j=1\ldots n \qquad \text{(Formula 131)}$$

Then, the impedance matrix Z and the admittance matrix Y for use to solve the above differential equations will be described below, taking a distributed constant filter 20 as shown in FIG. 4 as an example. FIG. 4A is an exploded perspective view, and FIG. 4B is an enlarged cross-sectional view showing a layered state.

This distributed constant filter 20 is a spiral layered type distributed constant filter containing a filter main body 22 having the transmission line wound like a spiral within the pot cores 21, 21 of Mn-Zn ferrite, the filter main body 22 comprising two tape shaped dielectric lines 23a, 23b made of polyimide, for example.

Figures 5, 6, 7:
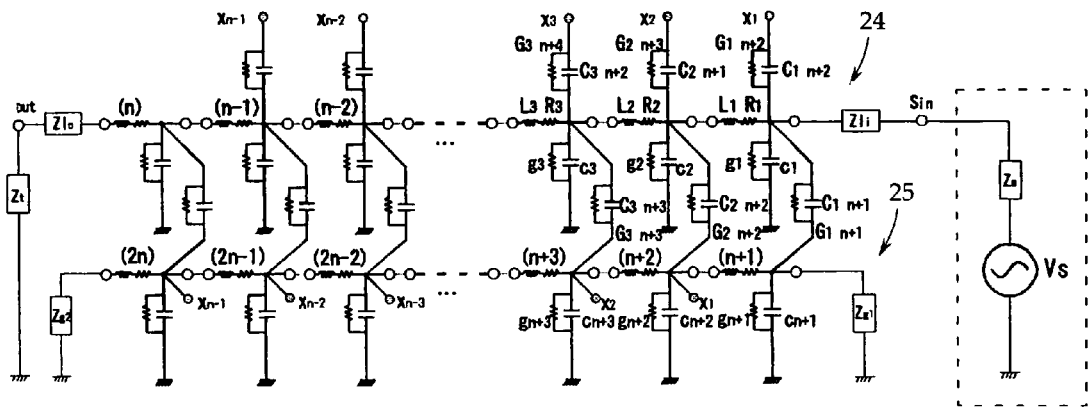
FIG. 5 is an equivalent circuit diagram of the spiral layered type distributed constant device.
FIG. 6 is a matrix diagram showing a magnetic coupling state between lines in the spiral layered type distributed constant device.
FIG. 7 is a matrix diagram showing a capacitive coupling state in the spiral layered type distributed constant device.

On one side of a tape shaped dielectric line 23a, a transmission line 24 composed of a copper foil having a thickness of 35 μm, for example, is formed. Also, on one side of a tape shaped dielectric line 23b, a ground (GND) line 25 composed of a copper foil having a thickness of 35 μm is formed. These two tape shaped dielectric lines 23a, 23b are wound like spiral. FIG. 5 shows an equivalent circuit of the distributed constant filter 20.

Herein, it is assumed that each line 24, 25 is virtually divided for each turn into 2n line segments. That is, supposing that each line 24, 25 is linked continuously, the transmission line 24 has the line segments 1 to n allocated, and the grounding line 25 has the line segments n+1 to 2n allocated. The line segment 1 of the transmission line 24 and the line segment n+1 of the grounding line 25 are associated, and the line segment n of the transmission line 24 and the line segment 2n of the grounding line 25 are associated, as shown in FIG. 5.

As shown in FIG. 5, there are various distributed parameters in each line segment. Since the magnetic coupling exists in all the line segments (each turn), the coupling between the distributed self-inductance $L_i$ [H/rad] and the distributed mutual inductance $M_{ij}$ [H/rad] is represented by a matrix as shown in FIG. 6.

In the matrix of FIG. 6, the diagonal element $L_i$ indicates the self-inductance in each line segment (turn), and the off-diagonal element $M_{ij}$ indicates the mutual coupling between line i and line j. The matrix of each ¼ block represents a magnetic coupling state in the transmission line 24 in the left upper ¼ block, and a magnetic coupling state in the grounding line 24 in the right lower ¼ block. And the remaining matrixes of ¼ block represent the magnetic coupling state between the transmission line 24 and the grounding line 25 in the left lower and right upper blocks. This matrix is multiplied by jω, and the resistance components $R_i$ are added to the diagonal components, whereby the impedance matrix Z as represented by the formula 106 is constructed.

On the other hand, the capacitive coupling exists only between adjacent lines via the tape shaped dielectric line, and is represented by a matrix as shown in FIG. 7, assuming that the distributed capacity between lines is $C_{ij}$ [F/rad], and the distributed capacity of each line in relation to the reference potential plane is $c_i$ [F/rad]. The admittance matrix Y as represented by the formula 110 is created based on this matrix.

The division and allocation of line segments may not be made for each turn. For example, assuming that one line segment is 0.5 turn, when one line is divided into n, double the n value in the above case is attained, whereby the magnetic coupling is in a combination of (even number segment) and (even number segment), or (odd number segment) and (odd number segment). At this time, the magnetic coupling matrix is represented in FIG. 8, and the capacitive coupling matrix is represented as shown in FIG. 9.

In this way, in virtually dividing one line, according to the invention, the line may be divided for any number of turn. If the distributed parameters for the coupling relation between line segments are input from the input section 11, the arithmetic operation section 12 solves the differential equations by combining the above matrixes.

In another form of the invention, the secondary simultaneous differential equations with the voltage $V(\theta)$ of each line segment as an unknown variable, as represented in the formula 112 (formula 1), is solved in accordance with a numerical solution algorithm for the differential equation under the boundary conditions regarding the voltage of each line segment that are given from the input section 11.

Similarly, the secondary simultaneous differential equations with the current $I(\theta)$ of each line segment as an unknown variable, as represented in the formula 120 (formula 7), is solved in accordance with a numerical solution algorithm for the differential equation under the boundary conditions regarding the current of each line segment that are given from the input section 11.

Also, similarly, the linearly simultaneous differential equations with the voltage $V(\theta)$ and current $I(\theta)$ of each line segment as unknown variables, as represented in the formula 126 (formula 10), is solved in accordance with a numerical solution algorithm for the differential equation under the boundary conditions regarding the voltage and current of each line segment that are given from the input section 11.

The numerical solution algorithm is preferably any one of the Runge-Kutta methods, Shooting methods (Gun methods), and Relaxation methods. These numerical solution algorithms involve providing the boundary conditions (boundary values) at predetermined positions in the line segment $\theta=Ai$ ($1 \leq i$), and acquiring the value at a desired position $\theta=B$ to be consistent with the boundary values at these points. Thereby, the solution values can be approximately obtained directly from the differential equation.

Referring to FIG. 10, a way of acquiring arbitrary variables (unknown variables) $p_i$, $q_i$ contained in the general solution of the differential equation will be described below. FIG. 10 is an equivalent circuit diagram that is simplified from the equivalent circuit of FIG. 5. In deciding the unknown variables $p_i$, $q_i$, the boundary conditions as listed in Table 1 are set up by the input section 11 in this example.

| | |
|---|---|
| $V_s$: | Signal source voltage (arbitary) |
| $Z_s$: | Signal source output impedance |
| $Z_{g1}$: | Signal source side grounding impedance |
| $Z_{g2}$: | Terminating side grounding impedance |
| $Z_t$: | Terminating load impedance |
| $Z_r$: | Transmission line/grounding line r-1 turn connection impedance |
| $Z_{gi \cdot r}$: | Transmission line/grounding line r-1 turn output side grounding impedance |
| $Z_{gi \cdot r}$: | Transmission line/grounding line r-1 turn input side grounding impedance |
| $Z_{li}$: | Impedance with lead wire at input end of transmission line |
| $Z_{lo}$: | Impedance with lead wire at ouput end of transmission line |

The arithmetic operation section 12 sets up the following formulas 132 to 137 under the given boundary conditions in accordance with the Kirchhoff's laws.

$$v_1(0) + (Z_s + Zl_i) \cdot i_1(0) = V_s \quad \text{(Formula 132)}$$

$$i_{n+1}(0) + v_{n+1}(0)/Z_{gl} = 0 \quad \text{(Formula 133)}$$

$$v_n(2\pi) - (Z_t + Zl_o) \cdot i_n(2\pi) = 0 \quad \text{(Formula 134)}$$

$$v_{2n}(2\pi) - Z_{g2} \cdot i_{2n}(2\pi) = 0 \quad \text{(Formula 135)}$$

$$i_r(0) - i_{r-1}(2\pi) + v_r(0)/Z_{go \cdot r} + v_{r-1}(2\pi)/Z_{gi \cdot r} = 0 (r=2 \ldots n, n+2 \ldots 2n) \quad \text{(Formula 136)}$$

$$(v_{r-1}(2\pi) - v_r(0))/Z_r - i_r(0) - v_r(0)/Z_{go \cdot r} = 0 (r=2 \ldots n, n+2 \ldots 2n) \quad \text{(Formula 137)}$$

Among them, the formulas 132 and 133 are boundary condition expressions regarding the signal source $V_s$, and the formulas 134 and 135 are boundary condition expressions regarding the terminating load $Z_t$. Also, the formulas 136 and 137 are boundary condition expressions at a connection point of each line. In each of the formulas, r takes a value from 2 to n and from n+2 to 2n, and 4n equations are prepared from all the formulas 132 to 137 to acquire the 4n unknown constants.

In the device as shown in FIG. 10, $V_s$, $Z_s$ and $Z_t$ are appropriately given according to the conditions, and supposing a structure in which the grounding line 25 is connected to the GND at the input side, it follows that $Z_{gi}=0$ and $Z_{g2}=\infty$. Also, since the transmission line 24 is continuously linked, it is sufficient that $Z_r=0$ and $Z_{gi \cdot r}=Z_{go \cdot r}=\infty$. In the following, the operation of the arithmetic operation section (computer) 12 to obtain the unknown variables will be described.

First of all, the formulas 132 and 133 which are boundary condition expressions regarding the signal source $V_s$ are performed by the following formulas 138 and 139.

$$v_1(0) + Z_s \cdot i_1(0) + Zl_i \cdot i_1(0) \quad \text{(Formula 138)}$$
$$= \sum_{i=1}^{2n} u_{1i} \cdot p_i + (Z_s + Zl_i)\left(\sum_{i=1}^{2n} \Psi(i, 1) \cdot q_i\right)$$
$$= \sum_{i=1}^{2n} \frac{u_{1i}}{f_{vsp(i)}} \cdot p_i + \sum_{i=1}^{2n} \frac{\{(Z_s + Zl_i) \cdot \Psi(i, 1)\} \cdot q_i}{f_{vsq(i)}} = V_s$$

$$v_{n+1}(0)/Z_{gl} + i_{n+1}(0) \quad \text{(Formula 139)}$$
$$= \sum_{i=1}^{2n} u_{n+1 \cdot i}/Z_{gl} \cdot p_i + \sum_{i=1}^{2n} \Psi(i, n+1) \cdot q_i$$
$$= \sum_{i=1}^{2n} \frac{u_{n+1 \cdot i}/Z_{gl}}{f_{isp(i)}} \cdot p_i + \sum_{i=1}^{2n} \frac{\Psi(i, n+1) \cdot q_i}{f_{isq(i)}}$$
$$= 0$$

The formulas 134 and 135 which are boundary condition expressions regarding the terminating load $Z_t$ are performed by the following formulas 140 and 141.

$$v_n(2\pi) - (Z_t + Zl_o) \cdot i_n(2\pi) \quad \text{(Formula 140)}$$
$$= \sum_{i=1}^{2n} \cosh(2\pi\gamma_i) u_{ni} \cdot p_i + \sum_{i=1}^{2n} \sinh(2\pi\gamma_i) u_{ni} \cdot q_i - (Z_t + Zl_o)$$
$$\left(\sum_{i=1}^{2n} \Psi(i, n)\sinh(2\pi\gamma_i) \cdot p_i + \sum_{i=1}^{2n} \Psi(i, n)\cosh(2\pi\gamma_i) \cdot q_i\right)$$
$$= \sum_{i=1}^{2n} \frac{(\cosh(2\pi\gamma_i) u_{ni} - (Z_t + Zl_o) \cdot \Psi(i, n)\sinh(2\pi\gamma_i)) \cdot p_i}{f_{gtp(i)}} +$$
$$\sum_{i=1}^{2n} \frac{(\sinh(2\pi\gamma_i) u_{ni} - (Z_t + Zl_o) \cdot \Psi(i, n)\cosh(2\pi\gamma_i)) \cdot q_i}{f_{gtq(i)}}$$
$$= 0$$

$$v_{2n}(2\pi) - Z_{g2} \cdot i_{2n}(2\pi)$$
$$= \sum_{i=1}^{2n} \cosh(2\pi\gamma_i) u_{2n \cdot i} \cdot p_i + \sum_{i=1}^{2n} \sinh(2\pi\gamma_i) u_{2n \cdot i} \cdot q_i - \quad \text{(Formula 141)}$$
$$Z_{g2}\left(\sum_{i=1}^{2n} \Psi(i, 2n)\sinh(2\pi\gamma_i) \cdot p_i + \sum_{i=1}^{2n} \Psi(i, 2n)\cosh(2\pi\gamma_i) \cdot \right.$$
$$\left. \sum_{i=1}^{2n} \Psi(i, 2n)\cosh(2\pi\gamma_i) \cdot q_i\right)$$
$$= \sum_{i=1}^{2n} \frac{(\cosh(2\pi\gamma_i) u_{2n \cdot i} - Z_{g2} \cdot \Psi(i, 2n)\sinh(2\pi\gamma_i)) \cdot p_i}{f_{gtp(i)}} +$$
$$\sum_{i=1}^{2n} \frac{(\sinh(2\pi\gamma_i) u_{2n \cdot i} - Z_{g2} \cdot \Psi(i, 2n)\cosh(2\pi\gamma_i)) \cdot q_i}{f_{gtq(i)}}$$
$$= 0$$

Also, the formulas 136 and 137 which are boundary condition expressions at a connection point of each transmission line are performed by the following formulas 142 and 143.

$$i_r(0) - i_{r-1}(2\pi) + v_r(0)/Z_{go\cdot r} + v_{r-1}(2\pi)/Z_{gi\cdot r} \quad \text{(Formula 142)}$$

$$= \sum_{i=1}^{2n} \Psi(i,r) \cdot q_i - \left( \sum_{i=1}^{2n} \Psi(i,r-1)\sinh(2\pi\gamma_i) \cdot p_i + \sum_{i=1}^{2n} \Psi(i,r-1)\cosh(2\pi\gamma_i) \cdot q_i \right) + \frac{1}{Z_{go\cdot r}} \left( \sum_{i=1}^{2n} u_{ri} \cdot p_i \right) + \frac{1}{Z_{gi\cdot r}} \left( \sum_{i=1}^{2n} \cosh(2\pi\gamma_i) u_{r-1\cdot i} \cdot p_i + \sum_{i=1}^{2n} \sinh(2\pi\gamma_i) u_{r-1\cdot i} \cdot q_i \right)$$

$$= \sum_{i=1}^{2n} \underbrace{\left( -\Psi(i,r-1)\sinh(2\pi\gamma_i) + \frac{1}{Z_{go\cdot r}} u_{ri} + \frac{1}{Z_{gi\cdot r}} \cosh(2\pi\gamma_i) u_{r-1\cdot i} \right) \cdot p_i}_{f_{vlq}(r,i)} + \sum_{i=1}^{2n} \underbrace{\left( \Psi(i,r) - \Psi(i,r-1)\cosh(2\pi\gamma_i) + \frac{1}{Z_{gi\cdot r}} \sinh(2\pi\gamma_i) u_{r-1\cdot i} \right) \cdot q_i}_{f_{vlq}(r,i)}$$

$$= 0$$

$$-v_r(0)/Z_r + v_{r-1}(2\pi)/Z_r - i_r(0) - v_r(0)/Z_{go\cdot r} \quad \text{(Formula 143)}$$

$$= -\frac{1}{Z_r} \left( \sum_{i=1}^{2n} u_{ri} \cdot p_i \right) + \frac{1}{Z_r} \left( \sum_{i=1}^{2n} \cosh(2\pi\gamma_i) u_{r-1\cdot i} \cdot p_i + \sum_{i=1}^{2n} \sinh(2\pi\gamma_i) u_{r-1\cdot i} \cdot q_i \right) - \sum_{i=1}^{2n} \Psi(i,r) \cdot q_i - \frac{1}{Z_{go\cdot r}} \left( \sum_{i=1}^{2n} u_{ri} \cdot p_i \right)$$

$$= \sum_{i=1}^{2n} \underbrace{\left( -\frac{1}{Z_r} \cdot u_{ri} + \frac{1}{Z_r} \cosh(2\pi\gamma_i) u_{r-1\cdot i} - \frac{1}{Z_{go\cdot r}} \cdot u_{ri} \right) \cdot p_i}_{f_{ilp}(r,i)} + \sum_{i=1}^{2n} \underbrace{\left( \frac{1}{Z_r} \sinh(2\pi\gamma_i) u_{r-1\cdot i} - \Psi(i,r) \right) \cdot q_i}_{f_{ilq}(r,i)}$$

$$= 0$$

Thereby, it follows that 4n equations are prepared for 4n unknown variables $p_1$ to $p_n$, $q_1$ to $q_n$, $p_{n+1}$ to $p_{2n}$, and $q_{n+1}$ to $q_{2n}$ from the formulas 138 to 143. The simultaneous equations are represented by the matrix of FIG. 11.

As described above, after deciding the arbitrary unknown constants p, q for the general solution regarding the voltage and current, the input/output voltage gain $A_v$, the input impedance $Z_{in}$ and the S parameter S for the transmission line 24 are obtained.

Firstly, for the input/output voltage gain $A_v$, the voltage of each line segment θ is represented by the formula 114, and $Z_{io}$ in the formula 134 is regarded as 0, whereby the input/output voltage gain $A_v$ is obtained from the 144.

$$A_v = \frac{v_n(2\pi)}{v_1(0)} \quad \text{(Formula 144)}$$

For the input impedance $Z_{in}$, since $Z_{1i}$ in the formula 132 is regarded as 0, the following formula 145 holds. If both sides of the formula 145 are divided by $I_1(0)$, the following formula 146 results. Accordingly, the input impedance $Z_{in}$ is obtained from the formula 147.

$$V_1(0) + Z_s \cdot I_1(0) = V_s \quad \text{(Formula 145)}$$

$$\frac{V_s}{I_1(0)} = Z_s + \frac{V_1(0)}{I_1(0)} \quad \text{(Formula 146)}$$

$$= Z_s + Z_{in}$$

$$Z_{in} = \frac{V_1(0)}{I_1(0)} \quad \text{(Formula 147)}$$

Based on the output impedance $Z_s$ of the signal source $V_s$ and the input impedance $Z_{in}$ of the transmission line 24 with load $Z_l$, the $S_{11}$ parameter is obtained from the following formula 148. Also, the $S_{21}$ parameter is obtained based on the $S_{11}$ parameter and the input/output voltage gain $A_v$ from the following formula 149.

$$S_{11} = \frac{Z_{in} - Z_s}{Z_{in} + Z_s} \quad \text{(Formula 148)}$$

$$S_{21} = (1 + S_{11})A_v \quad \text{(Formula 149)}$$

EXAMPLES

For a model including three lines 1 to 3 wired in parallel as shown in FIG. 12, a specific analysis example will be described. The lines 1 to 3 are magnetically coupled with each other, and capacitively coupled with each other. Also, in the case where they are capacitively coupled with the GND, the characteristics for high frequency three-phase AC current are analyzed. The specifications are as follows.

Length of line: 1.0 m
Signal sources $V_1$, $V_2$, $V_3$ (vector values) of lines 1, 2, 3:
$V_1 = 5\{\cos(\omega t) + j \cdot \sin(\omega t)\}$
$V_2 = 5\{\cos(\omega t + 2/3\pi) + j \cdot \sin(\omega t + 2/3\pi)\}$
$V_3 = 5\{\cos(\omega t - 2/3\pi) + j \cdot \sin(\omega t - 2/3\pi)\}$
Output impedance of signal source: $Z_{s1} = Z_{s2} = Z_{s3} = 50\ \Omega$
GND capacity: $C_1 = C_2 = C_3 = 1000$ pF
Capacity between lines: $C_{12} = C_{23} = 100$ pF, $C_{31} = 50$ pF
Distributed self-inductance of line: 25 μH/m
Connection coefficient: k=0.5
Line load: $Z_{t1} = Z_{t2} = Z_{t3} = 100\ \Omega$
The unknown variables of this model (unknown variables $p_1$, $q_1$ of line 1, unknown variables $p_2$, $q_2$ of line 2, unknown variables $p_3$, $q_3$ of line 3) are decided. The boundary conditions for each of the lines 1 to 3 on the signal source are represented by the following formulas 150, 151 and 152.

$$\dot{V}_1 - i_1(0) \cdot Z_{s1} = v_1(0) \quad \text{(Formula 150)}$$

$$\dot{V}_2 - i_2(0) \cdot Z_{s2} = v_2(0) \quad \text{(Formula 151)}$$

$$\dot{V}_3 - i_3(0) \cdot Z_{s3} = v_3(0) \quad \text{(Formula 152)}$$

These formulas are transformed into the following formulas 153, 154 and 155.

$$v_1(0) + i_1(0) \cdot Z_{s1} = \dot{V}_1 \quad \text{(Formula 153)}$$

$$v_2(0) + i_2(0) \cdot Z_{s2} = \dot{V}_2 \quad \text{(Formula 154)}$$

$$v_3(0) + i_3(0) \cdot Z_{s3} = \dot{V}_3 \quad \text{(Formula 155)}$$

The left sides of these formulas are rewritten with the general solution of the differential equation to obtain the following formulas 156, 157 and 158.

$$\sum_{i=1}^{3} u_{1i} \cdot p_i + Z_{s1} \sum_{i=1}^{3} \Psi(i, 1) \cdot q_i = \dot{V}_1 \quad \text{(Formula 156)}$$

$$\sum_{i=1}^{3} u_{2i} \cdot p_i + Z_{s2} \sum_{i=1}^{3} \Psi(i, 2) \cdot q_i = \dot{V}_2 \quad \text{(Formula 157)}$$

$$\sum_{i=1}^{3} u_{3i} \cdot p_i + Z_{s3} \sum_{i=1}^{3} \Psi(i, 3) \cdot q_i = \dot{V}_3 \quad \text{(Formula 158)}$$

On the other hand, the boundary conditions of each of the lines 1 to 3 on the load side are represented by the following formulas 159, 160 and 161.

$$i_1(2\pi) \cdot Z_{l1} = v_1(2\pi) \quad \text{(Formula 159)}$$

$$i_2(2\pi) \cdot Z_{l2} = v_2(2\pi) \quad \text{(Formula 160)}$$

$$i_3(2\pi) \cdot Z_{l3} = v_3(2\pi) \quad \text{(Formula 161)}$$

These formulas are transformed into the formulas 162, 163 and 164.

$$v_1(2\pi) - i_1(2\pi) \cdot Z_{l1} = 0 \quad \text{(Formula 162)}$$

$$v_2(2\pi) - i_2(2\pi) \cdot Z_{l2} = 0 \quad \text{(Formula 163)}$$

$$v_3(2\pi) - i_3(2\pi) \cdot Z_{l3} = 0 \quad \text{(Formula 164)}$$

The left sides of these formulas are rewritten with the general solution of the differential equation to obtain the following formulas 165, 166 and 167.

$$\sum_{i=1}^{3} \{\cosh(2\pi\gamma_i) u_{1i} - Z_{l1} \Psi(i, 1) \sinh(2\pi\gamma_i)\} p_i + \quad \text{(Formula 165)}$$
$$\sum_{i=1}^{3} \{\sinh(2\pi\gamma_i) u_{1i} - Z_{l1} \Psi(i, 1) \cosh(2\pi\gamma_i)\} q_i = 0$$

$$\sum_{i=1}^{3} \{\cosh(2\pi\gamma_i) u_{2i} - Z_{l2} \Psi(i, 2) \sinh(2\pi\gamma_i)\} p_i + \quad \text{(Formula 166)}$$
$$\sum_{i=1}^{3} \{\sinh(2\pi\gamma_i) u_{2i} - Z_{l2} \Psi(i, 2) \cosh(2\pi\gamma_i)\} q_i = 0$$

$$\sum_{i=1}^{3} \{\cosh(2\pi\gamma_i) u_{3i} - Z_{l3} \Psi(i, 3) \sinh(2\pi\gamma_i)\} p_i + \quad \text{(Formula 167)}$$
$$\sum_{i=1}^{3} \{\sinh(2\pi\gamma_i) u_{3i} - Z_{l3} \Psi(i, 3) \cosh(2\pi\gamma_i)\} q_i = 0$$

A total of six simultaneous equations composed the formulas 156, 157 and 158 and the formulas 165, 166 and 167 are solved to decide six unknown variables $p_1$, $p_2$, $p_3$, $q_1$, $q_2$, $q_3$.

Figure 13A:
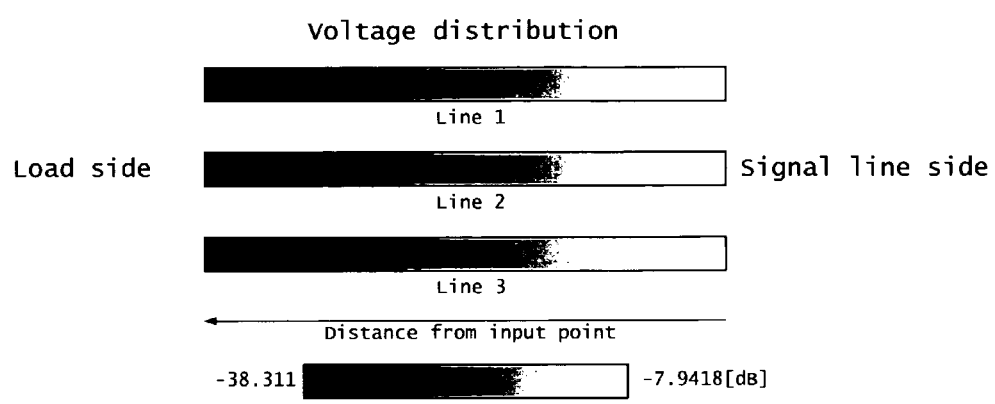
FIG. 13A is a schematic diagram showing an output example of voltage distribution in the above analysis example.
Figure 13B:
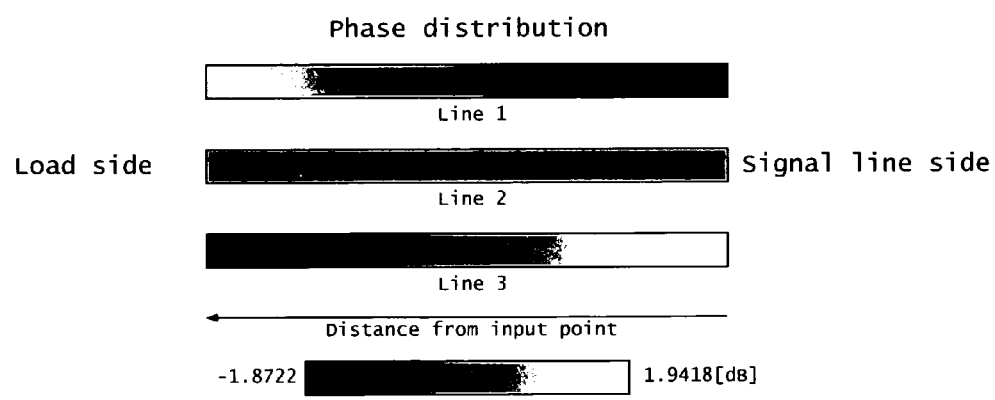
FIG. 13B is a schematic diagram showing an output example of phase distribution in the above analysis example.

Next, an output example will be described below. According to this invention, the distributions of the characteristic data of each of the lines 1 to 3, viz., voltage and current magnitude, phase, real element, imaginary element, and instantaneous value, are two-dimensionally displayed in different colors or densities corresponding to their values. As one example, FIG. 13A shows an output chart representing the voltage distribution of each of the lines 1 to 3 in densities with reference to a signal voltage (frequency 33 MHz), and FIG. 13B shows an output chart representing the phase distribution of each of the lines 1 to 3 in densities.

Figure 14A:
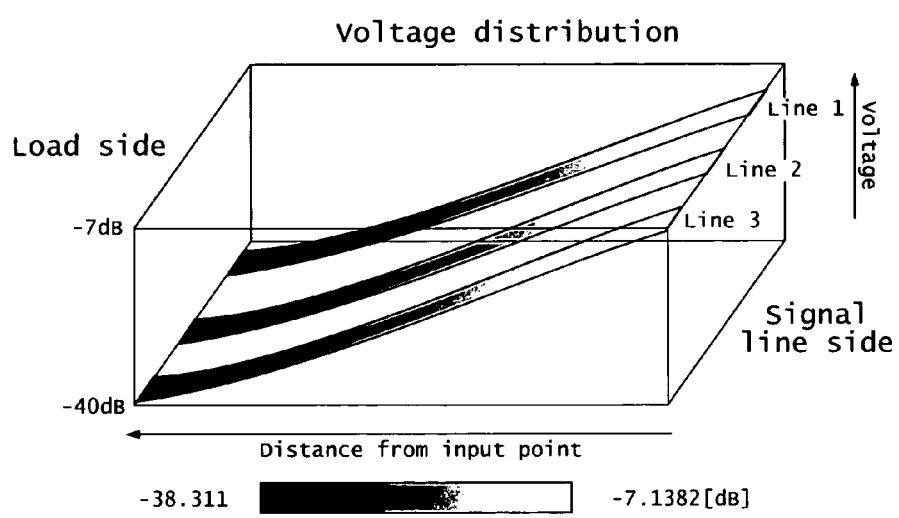
FIG. 14A is a schematic diagram showing another output example of phase distribution in the above analysis example.
Figure 14B:
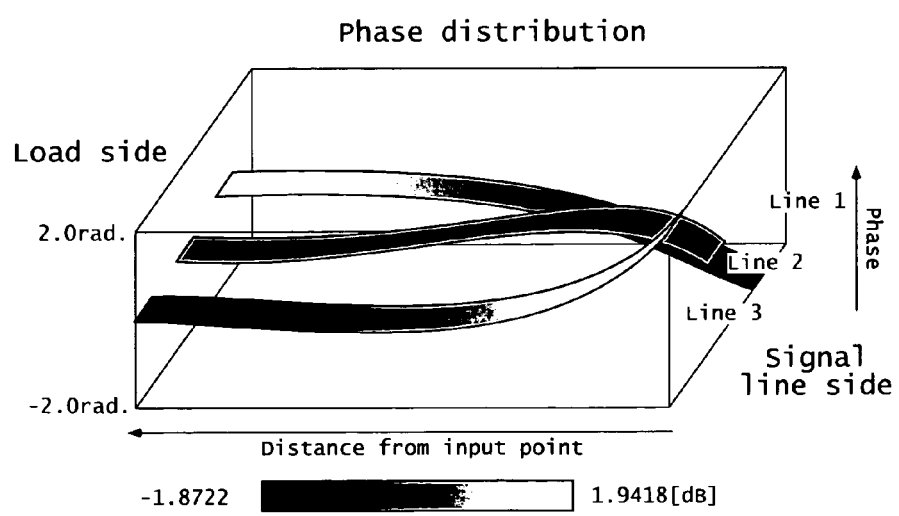
FIG. 14B is a schematic diagram showing another output example of phase distribution in the above analysis example.

Also, in a three dimensional display in XYZ, it is possible that the distribution coordinates are allocated to two axes of X-Y, and the output magnitude is allocated to the remaining Z axis, for example. FIG. 14A shows a three dimensional display in which the voltage distribution of each of the lines 1 to 3 is represented in colors or densities, and FIG. 14B shows a three dimensional display in which the phase distribution of each of the lines 1 to 3 is represented in colors or densities.

Figure 15A:
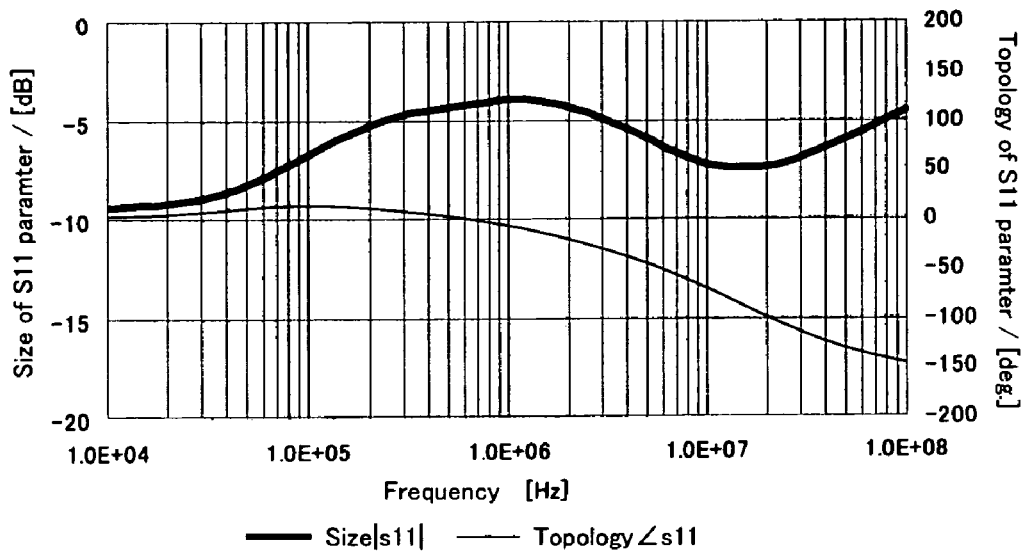
FIG. 15A is a graph showing an output example of the $S_{11}$ parameter in the above analysis example.
Figure 15B:
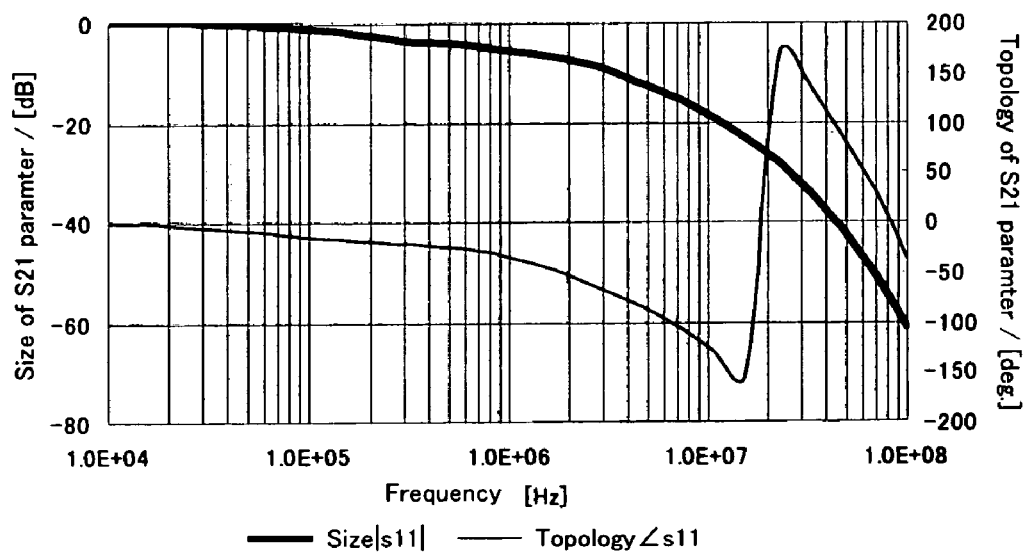
FIG. 15B is a graph showing an output example of the $S_{21}$ parameter in the above analysis example.

Also, a graphical representation is allowed in which the frequency is taken along the transverse axis and the output value (or phase angle) is taken along the longitudinal axis. As one example, FIG. 15A shows the $S_{11}$ parameter characteristic of line 1, and FIG. 15B shows the $S_{21}$ parameter characteristic of line 1. In these figures, the bold line indicates the size of S parameter and the thin line indicates the phase angle of S parameter.

Figure 15C:
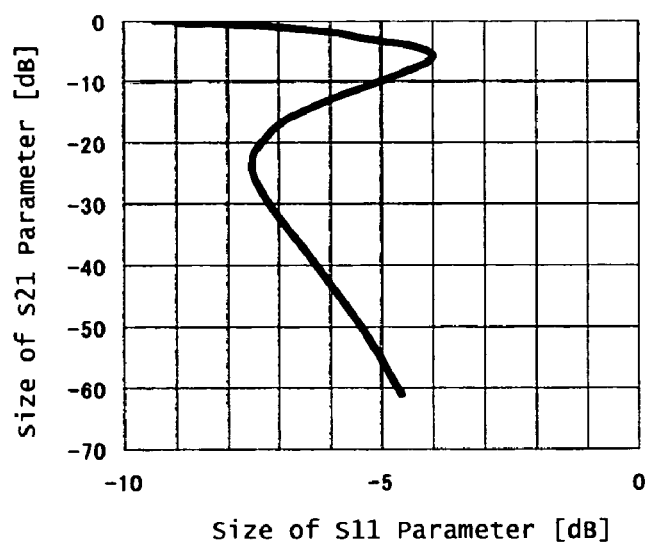
FIG. 15C is a graph showing the correlation in the size between $S_{11}$ parameter and $S_{21}$ parameter.
Figure 15D:
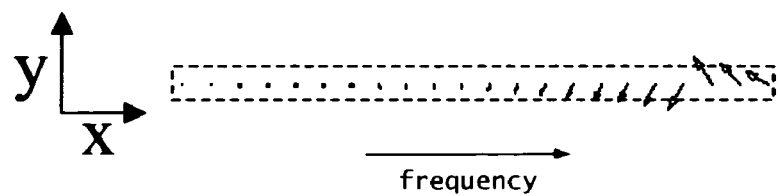
FIG. 15D is a vector diagram showing the correlation in the phase between $S_{11}$ parameter and $S_{21}$ parameter.

Also, a correlation graph between $S_{11}$ parameter and $S_{21}$ parameter may be displayed in a coordinate system in which the transverse axis is the size of $S_{11}$ parameter and the longitudinal axis is the size of $S_{21}$ parameter, as shown in FIG. 15C. Moreover, a vector diagram may be displayed in which the topology of $S_{11}$ parameter is allocated to the X vector component and the topology of $S_{21}$ parameter is allocated to the Y vector component, as shown in FIG. 15D.

What is claimed is:

1. An apparatus for analyzing a distributed constant in a transmission line, comprising:
   an input section for inputting distributed parameters for each line segment virtually and arbitrarily divided in said transmission line to be analyzed;
   an arithmetic operation section for calculating characteristic data of said transmission line by performing a predetermined arithmetic operation based on said distributed parameters input from said input section; and
   an output section for outputting the characteristic data,
   wherein said distributed parameters input from said input section include a distributed self-inductance $L_i$, a distributed resistance $R_i$, and a distributed capacitance $c_i$ and a distributed conductance $g_i$ in relation to a reference potential plane in said transmission line, and a distributed mutual inductance $M_{ij}$, a distributed capacitance $C_{ij}$, and a distributed conductance $G_{ij}$ between said transmission line and another transmission line,
   wherein said arithmetic operation section calculates the characteristic data in said transmission line by solving a differential equation regarding electromagnetic interaction of said each line segment based on predetermined distributed parameters being input from the input section, and
   wherein said arithmetic operation section comprises a secondary simultaneous differential equations as represented in a following formula 1 regarding electromagnetic interaction of said each line segment with the voltage V(θ) of said each line segment in said transmission line as an unknown variable (in the formula 1, V(θ) is a column vector of n×1 as represented in a following formula 2, Z is an impedance matrix created based on said distributed parameters as represented in a following formula 3, Y is an admittance matrix created based on said distributed parameters as represented in a following formula 4), in which said secondary simultaneous differential equations as represented in the formula 1 are solved by obtaining the eigenvalues $y_i^2$ (i=1 to n: n is a virtually divided number of line segments) of a complex coefficient matrix $-ZY$ with said impedance matrix Z and said admittance matrix Y, thereby acquiring a general solution ($p_i$, $q_i$ are arbitrary constants, and $u_i$ (i=1 to n) are eigenvectors corresponding to said eigenvalues $\gamma_i^2$) of voltage and current I($\theta$) as represented in a following formula 5 and a following formula 6a or 6b at a limited position on said each line segment $$\frac{d^2}{d\theta^2}V(\theta) = -ZY \cdot V(\theta) \quad \text{(Formula 1)}$$

$$V(\theta) = \begin{pmatrix} v_1(\theta) \\ v_2(\theta) \\ \vdots \\ v_n(\theta) \end{pmatrix} \quad \text{(Formula 2)}$$

$$Z = \begin{pmatrix} (R_1+j\omega L_1) & j\omega M_{12} & \cdots & j\omega M_{1n} \\ j\omega M_{21} & (R_2+j\omega L_2) & \cdots & j\omega M_{2n} \\ \vdots & \vdots & \ddots & \vdots \\ j\omega M_{n1} & j\omega M_{n2} & \cdots & (R_n+j\omega L_n) \end{pmatrix} \quad \text{(Formula 3)}$$

$$Y = \begin{pmatrix} \xi_2 & (G_{12}+j\omega G_{12}) & \cdots & (G_{1n}+j\omega C_{1n}) \\ (G_{21}+j\omega C_{21}) & \xi_2 & \cdots & (G_{2n}+j\omega C_{2n}) \\ \vdots & \vdots & \ddots & \vdots \\ (G_{n1}+j\omega C_{n1}) & (G_{n2}+j\omega C_{n2}) & \cdots & \xi_n \end{pmatrix} \quad \text{(Formula 4)}$$

wherein, $\xi_j = -\left\{(g_j+j\omega c_j) + \sum_{k=1,k\neq j}^{n}(G_{jk}+j\omega C_{jk})\right\}$ $$V(\theta) = \sum_{i=2}^{n}(p_i \cosh(\gamma_i \theta) + q_i \sinh(\gamma_i \theta))u_i \quad \text{(Formula 5)}$$

$$I(\theta) = Y\int V(\theta)d\theta \quad \text{(Formula 6a)}$$
$$= Y\sum_{i=1}^{n}\frac{1}{\gamma_i}\{p_i \sinh(\gamma_i \theta) + q_i \cosh(\gamma_i \theta)\}u_i$$

or, $$I(\theta) = -Z^{-1}\sum_{i=1}^{n}\gamma_i\{p_1 \sinh(\gamma_1 \theta) + q_1 \cosh 1(\gamma_1 \theta)\}d\theta. \quad \text{(Formula 6b)}$$

2. The apparatus for analyzing the distributed constant in the transmission line according to claim 1, wherein said arithmetic operation section further calculates arbitrary constants (unknown variables) $p_i$, $q_i$ (i=1 to n) included in said general solution of voltage and current as represented in said formula 5 and the formula 6a or 6b under boundary conditions of said each line segment which are input from said input section.

3. The apparatus for analyzing the distributed constant in the transmission line according to claim 2, wherein said arithmetic operation section calculates an input/output voltage gain $A_v$ from an input voltage and a terminating voltage of said transmission line after obtaining the arbitrary constants of the general solution regarding the voltage and current.

4. The apparatus for analyzing the distributed constant in the transmission line according to claim 2, wherein said arithmetic operation section calculates an input impedance $Z_{in}$ of said transmission line based on a signal source voltage $V_s$ and a signal source output impedance $Z_s$ included in the boundary conditions given from said input section after obtaining the arbitrary constants of the general solution regarding the voltage and current.

5. The apparatus for analyzing the distributed constant in the transmission line according to claim 2, wherein said arithmetic operation section calculates an input/output voltage gain $A_v$ from an input voltage and a terminating voltage of said transmission line after obtaining the arbitrary constants of the general solution regarding the voltage and current, and calculates an input impedance $Z_{in}$ of said transmission line based on a signal source voltage $V_s$ and a signal source output impedance $Z_s$ included in the boundary conditions given from said input section, thereby acquiring an S parameter $S_{11}$ from said signal source output impedance $Z_s$ and said input impedance $Z_{in}$, and an S parameter $S_{21}$ from said S parameter $S_{11}$ and said input/output voltage gain $A_v$.

6. The apparatus for analyzing the distributed constant in the transmission line according to claim 1, wherein said arithmetic operation section solves the secondary simultaneous differential equations as represented in a following formula 7 regarding electromagnetic interaction of said each line segment with the current I($\theta$) of said each line segment in said transmission line as an unknown variable, instead of said secondary simultaneous differential equations as represented in the formula 1, thereby acquiring a general solution of voltage and current as represented in a following formula S and a following formula 9a or 9b at a limited position on said each line segment $$\frac{d^2}{d\theta^2}I(\theta) = -YZ \cdot I(\theta) \quad \text{(Formula 7)}$$

$$I(\theta) = \sum_{i=1}^{n}(p_i \cosh(\gamma_i \theta) + q_i \sinh(\gamma_i \theta))u_i \quad \text{(Formula 8)}$$

$$V(\theta) = -Z\int I(\theta)d\theta \quad \text{(Formula 9a)}$$
$$= -Z\sum_{i=1}^{n}\frac{1}{\gamma_i}\{p_i \sinh(\gamma_i \theta) + q_i \cosh(\gamma_i \theta)\}u_i$$

OR, $$V(\theta) = -Z^{-1}\sum_{i=1}^{n}\gamma_i\{p_i \sinh(\gamma_i \theta) + q_i \cosh(\gamma_i \theta)\}u_i. \quad \text{(Formula 9b)}$$

7. The apparatus for analyzing the distributed constant in the transmission line according to claim 6, wherein said arithmetic operation section solves the secondary simultaneous differential equations as represented in the formula 7 with the current I($\theta$) of said each line segment as an unknown variable under boundary conditions regarding the current of said each line segment given from said input section in accordance with a numerical solution algorithm of the differential equation.

8. The apparatus for analyzing the distributed constant in the transmission line according to claim 1, wherein said arithmetic operation section comprises linearly simultaneous differential equations as represented in a following formula 10 regarding electromagnetic interaction of said each line segment with the voltage V($\theta$) and current I($\theta$) of said each line segment in said transmission line as unknown variables (in the formula 10, W($\theta$) is a matrix containing V($\theta$)$_{n+1}$ and I($\theta$)$_{n\times 1}$ as represented in a following formula 11, A is a matrix as represented in a following formula 12 containing the impedance matrix Z created based on said distributed parameters as represented in the formula 3 and the admittance matrix Y created based on said distributed parameters as represented in the formula 4), in which said linearly simultaneous differential equations as represented in the formula 10 are solved by obtaining 2n eigenvalues $\gamma_i^2$ (i=1 to 2n) of said matrix A, thereby acquiring a general solution ($\alpha_i$ (i=1 to 2n) are arbitrary constants, and $U_i$ (i=1 to 2n) are eigenvectors corresponding to said eigenvalues $\gamma_i$) of voltage and current as represented in a following formula 13

$$\frac{d}{d\theta} W(\theta) = A \cdot W(\theta) \quad \text{(Formula 10)}$$

$$W(\theta) = \begin{pmatrix} V(\theta)_{n\times 1} \\ I(\theta)_{n\times 1} \end{pmatrix} = \begin{pmatrix} v_1(\theta) \\ v_2(\theta) \\ \vdots \\ v_n(\theta) \\ i_1(\theta) \\ i_2(\theta) \\ \vdots \\ i_n(\theta) \end{pmatrix} \quad \text{(Formula 11)}$$

$$A = \begin{pmatrix} 0_{n\times n} & -Z \\ Y & 0_{n\times n} \end{pmatrix}_{2n\times 2n} \quad \text{(Formula 12)}$$

$$W(\theta) = \sum_{i=1}^{2n} \alpha_i e^{\gamma_i \theta} u_i. \quad \text{(Formula 13)}$$

9. The apparatus for analyzing the distributed constant in the transmission line according to claim 8, wherein said arithmetic operation section sets up 2n simultaneous equations under boundary conditions of said each line segment input from said input section for each of the j-th (j=1 to n) components of a voltage vector as represented in a following formula 14 and a current vector as represented in a following formula 15 in the transmission line, which are derived from the general solution as represented in the formula 13, thereby acquiring 2n arbitrary constants (unknown variables) $\gamma_i$ $$v_j(\theta) = \sum_{i=1}^{2n} \alpha_i e^{\gamma_i \theta} u_{ji} \quad \text{(Formula 14)}$$

$$i_j(\theta) = \sum_{i=1}^{2n} \alpha_i e^{\gamma_i \theta} u_{n+ji}. \quad \text{(Formula 15)}$$

10. The apparatus for analyzing the distributed constant in the transmission line according to claim 8, wherein said arithmetic operation section solves the linearly simultaneous differential equations as represented in the formula 10 with the voltage $V(\theta)$ and current $I(\theta)$ of said each line segment as unknown variables under boundary conditions regarding the voltage and current of said each line segment given from said input section in accordance with a numerical solution algorithm of the differential equation.

11. The apparatus for analyzing the distributed constant in the transmission line according to claim 1, wherein said transmission line is included in an equipment including a connector, a sensor or a filter to allow the distributed constant characteristics of said equipment itself to be analyzed.

12. The apparatus for analyzing the distributed constant in the transmission line according to claim 1, wherein said arithmetic operation section solves the secondary simultaneous differential equations as represented in the formula 1 with the voltage $V(\theta)$ of said each line segment as an unknown variable under boundary conditions regarding the voltage of said each line segment given from said input section in accordance with a numerical solution algorithm of the differential equation.

13. The apparatus for analyzing the distributed constant in the transmission line according to claim 12, wherein said numerical solution algorithm is one of the Runge-Kutta methods, Shooting methods (Gun methods), and Relaxation methods.

14. A computer-readable medium storing a computer-executable program for instructing an apparatus for performing a method for analyzing a distributed constant in a transmission line, wherein said apparatus comprises an input section for inputting distributed parameters for each line segment virtually and arbitrarily divided in said transmission line to be analyzed;

an arithmetic operation section for calculating characteristic data of said transmission line by performing a predetermined arithmetic operation based on said distributed parameters input from said input section; and an output section for outputting the characteristic data, wherein said distributed parameters input from said input section include a distributed self-inductance $L_i$, a distributed resistance $R_i$, and a distributed capacitance $c_i$ and a distributed conductance $g_i$ in relation to a reference potential plane in said transmission line, and a distributed mutual inductance $M_{ij}$, a distributed capacitance $Cr_{ij}$, and a distributed conductance $G_{ij}$ between said transmission line and another transmission line, wherein said arithmetic operation section calculates the characteristic data in said transmission line by solving a differential equation regarding electromagnetic interaction of said each line segment based on predetermined distributed parameters being input from the input section, and wherein said arithmetic operation section comprises a secondary simultaneous differential equations as represented in a following formula 1 regarding electromagnetic interaction of said each line segment with the voltage $V(\theta)$ of said each line segment in said transmission line as an unknown variable (in the formula 1, $V(\theta)$ is a column vector of n×1 as represented in a following formula 2, Z is an impedance matrix created based on said distributed parameters as represented in a following formula 3, Y is an admittance matrix created based on said distributed parameters as represented in a following formula 4), in which said secondary simultaneous differential equations as represented in the formula 1 are solved by obtaining the eigenvalues $\gamma_i^2$ (i=1 to n: n is a virtually divided number of line segments) of a complex coefficient matrix $-ZY$ with said impedance matrix Z and said admittance matrix Y, thereby acquiring a general solution ($p_i$, $q_i$ are arbitrary constants, and $u_i$ (i=1 to n) are eigenvectors corresponding to said eigenvalues $\gamma_i^2$) of voltage and current $I(\theta)$ as represented in a following formula 5 and a following formula 6a or 6b at a limited position on said each line segment $$\frac{d^2}{d\theta^2} V(\theta) = -ZY \cdot V(\theta) \quad \text{(Formula 1)}$$

$$V(\theta) = \begin{pmatrix} v_1(\theta) \\ v_2(\theta) \\ \vdots \\ v_n(\theta) \end{pmatrix} \quad \text{(Formula 2)}$$

-continued $$Z = \begin{pmatrix} (R_1 + j\omega L_1) & j\omega M_{12} & \cdots & j\omega M_{1n} \\ j\omega M_{21} & (R_2 + j\omega L_2) & \cdots & j\omega M_{2n} \\ \vdots & \vdots & \ddots & \vdots \\ j\omega M_{n1} & j\omega M_{n2} & \cdots & (R_n + j\omega L_n) \end{pmatrix} \quad \text{(Formula 3)}$$

$$Y = \begin{pmatrix} \xi_1 & (G_{12} + j\omega C_{12}) & \cdots & (G_{1n} + j\omega C_{1n}) \\ (G_{21} + j\omega C_{21}) & \xi_2 & \cdots & (G_{2n} + j\omega C_{2n}) \\ \vdots & \vdots & \ddots & \vdots \\ (G_{n1} + j\omega C_{n1}) & (G_{n2} + j\omega C_{n2}) & \cdots & \xi_n \end{pmatrix} \quad \text{(Formula 4)}$$

wherein, $\xi_j = -\left\{ (g_j + j\omega c_j) + \sum_{k=1, k \neq j}^{n} (G_{jk} + j\omega C_{jk}) \right\}$ $$V(\theta) = \sum_{i=1}^{n} (p_i \cosh(\gamma_i \theta) + q_i \sinh(\gamma_i \theta)) u_i \quad \text{(Formula 5)}$$

$$I(\theta) = Y \int V(\theta) d\theta \quad \text{(Formula 6a)}$$

$$= Y \sum_{i=1}^{n} \frac{1}{\gamma_i} \{ p_i \sinh(\gamma_i \theta) + q_i \cosh(\gamma_i \theta) \} u_i$$

or, $$I(\theta) = -Z^{-1} \sum_{i=1}^{n} \gamma_i \{ p_1 \sinh(\gamma_i \theta) + q_1 \cosh(\gamma_1 \theta) \} d\theta \quad \text{(Formula 6b)}$$

wherein said arithmetic operation section comprises a computer, and wherein the method comprises:

setting up the secondary simultaneous differential equations as represented in the formula 1 regarding electromagnetic interaction of said each line segment with the voltage $V(\theta)$ of said each line segment virtually and arbitrarily divided in said transmission line to be analyzed as the unknown variable (in the formula 1, $V(\theta)$ is the column vector of n×1 as represented in the formula 2, Z is the impedance matrix created based on said distributed parameters as represented in the formula 3, Y is the admittance matrix created based on said distributed parameters as represented in the formula 4), and solving said secondary simultaneous differential equations as represented in the formula 1 by obtaining the eigenvalues $\gamma_i^2$ (i=1 to n: n is the virtually divided number of line segments) of the complex coefficient matrix $-ZY$ with said impedance matrix Z and said admittance matrix Y from a distributed self-inductance $L_i$, a distributed resistance $R_i$, and a distributed capacitance $c_i$ and a distributed conductance $g_i$ in relation to a reference potential plane in said transmission line, and a distributed mutual inductance $M_{ij}$, a distributed capacitance $c_{ij}$, and a distributed conductance $G_{ij}$ between said transmission line and another transmission line, which are input from said input section, thereby acquiring a general solution ($p_i$, $q_i$ are arbitrary constants, and $u_i$ (i=1 to n) are eigenvectors corresponding to said eigenvalues $\gamma_i^2$) of voltage and current as represented in the formula 5 and the formula 6a or 6b at a limited position on said each line segment.

15. The computer-readable medium according to claim 14, wherein said computer further calculates arbitrary constants (unknown variables) $p_i$, $q_i$ (i=1 to n) included in the general solution of voltage and current as represented in the formula 5 and the formula 6a or 6b under boundary conditions of said each line segment that are input from said input section.

16. The computer-readable medium according to claim 14, wherein said computer sets up the secondary simultaneous differential equations as represented in a following formula 7 regarding electromagnetic interaction of said each line segment with the current $I(\theta)$ of said each line segment in said transmission line as the unknown variable, instead of said secondary simultaneous differential equations as represented in the formula 1, and solves said secondary simultaneous differential equations as represented in the formula 7 by obtaining the eigenvalues $\gamma_i^2$ (i=1 to n: n is the virtually divided number of line segments) of the complex coefficient matrix $-ZY$ with said impedance matrix Z and said admittance matrix Y, thereby acquiring a general solution of voltage and current as represented in a following formula 8 and a following formula 9a or 9b at the limited position on said each line segment $$\frac{d^2}{d\theta^2} I(\theta) = -YZ \cdot I(\theta) \quad \text{(Formula 7)}$$

$$I(\theta) = \sum_{i=1}^{n} (p_i \cosh(\gamma_i \theta) + q_i \sinh(\gamma_i \theta)) u_i \quad \text{(Formula 8)}$$

$$V(\theta) = -Z \int I(\theta) d\theta \quad \text{(Formula 9a)}$$

$$= -Z \sum_{i=1}^{n} \frac{1}{\gamma_i} \{ p_i \sinh(\gamma_i \theta) + q_i \cosh(\gamma_i \theta) \} u_i$$

OR, $$V(\theta) = -Z^{-1} \sum_{i=1}^{n} \gamma_i \{ p_i \sinh(\gamma_i \theta) + q_i \cosh(\gamma_i \theta) \} u_i. \quad \text{(Formula 9b)}$$

17. A computer-readable medium storing a computer-executable program for instructing an apparatus for performing a method for analyzing a distributed constant in a transmission line, wherein said apparatus comprises an input section for inputting distributed parameters for each line segment virtually and arbitrarily divided in said transmission line to be analyzed;

an arithmetic operation section for calculating characteristic data of said transmission line by performing a predetermined arithmetic operation based on said distributed parameters input from said input section; and an output section for outputting the characteristic data, wherein said distributed parameters input from said input section include a distributed self-inductance $L_i$, a distributed resistance $R_i$, and a distributed capacitance $c_i$ and a distributed conductance $g_i$ in relation to a reference potential plane in said transmission line, and a distributed mutual inductance $M_{ij}$, a distributed capacitance $C_{ij}$, and a distributed conductance $G_{ij}$ between said transmission line and another transmission line, wherein said arithmetic operation section calculates the characteristic data in said transmission line by solving a differential equation regarding electromagnetic interaction of said each line segment based on predetermined distributed parameters being input from the input section, and wherein said arithmetic operation section comprises a secondary simultaneous differential equations as represented in a following formula 1 regarding electromagnetic interaction of said each line segment with the voltage $V(\theta)$ of said each line segment in said transmission line as an unknown variable (in the formula 1, v(θ) is a column vector of n×1 as represented in a following formula 2, Z is an impedance matrix created based on said distributed parameters as represented in a following formula 3, Y is an admittance matrix created based on said distributed parameters as represented in a following formula 4), in which said secondary simultaneous differential equations as represented in the formula 1 are solved by obtaining the eigenvalues $\gamma_i^2$ (i=1 to n: n is a virtually divided number of line segments) of a complex coefficient matrix $-ZY$ with said impedance matrix Z and said admittance matrix Y, thereby acquiring a general solution ($P_i$, $q_i$ are arbitrary constants, and $u_i$ (i=1 to n) are eigenvectors corresponding to said eigenvalues $\gamma_i^2$) of voltage and current I(θ) as represented in a following formula 5 and a following formula 6a or 6b at a limited position on said each line segment $$\frac{d^2}{d\theta^2} V(\theta) = -ZY \cdot V(\theta) \quad \text{(Formula 1)}$$

$$V(\theta) = \begin{pmatrix} v_1(\theta) \\ v_2(\theta) \\ \vdots \\ v_n(\theta) \end{pmatrix} \quad \text{(Formula 2)}$$

$$Z = \begin{pmatrix} (R_2 + j\omega L_2) & j\omega M_{22} & \cdots & j\omega M_{1n} \\ j\omega M_n & (R_2 + j\omega L_2) & \cdots & j\omega M_{2n} \\ \vdots & \vdots & \ddots & \vdots \\ j\omega M_{n1} & j\omega M_{n2} & \cdots & (R_n + j\omega L_n) \end{pmatrix} \quad \text{(Formula 3)}$$

$$Y = \begin{pmatrix} \xi_2 & (G_{12} + j\omega C_{12}) & \cdots & (G_{1n} + j\omega C_{1n}) \\ (G_{22} + j\omega C_{22}) & \xi_2 & \cdots & (G_{2n} + j\omega C_{2n}) \\ \vdots & \vdots & \ddots & \vdots \\ (G_{n1} + j\omega C_{n2}) & (G_{n2} + j\omega C_{n2}) & \cdots & \xi_n \end{pmatrix} \quad \text{(Formula 4)}$$

wherein, $\xi_j = -\left\{(g_j + j\omega c_j) + \sum_{k=3, k \neq 3}^{n} (G_{jk} + j\omega C_{jk})\right\}$ $$V(\theta) = \sum_{i=1}^{n} (p_i \cosh(\gamma_i \theta) + g_i \sinh(\gamma_i \theta)) u_i \quad \text{(Formula 5)}$$

$$I(\theta) = Y \int V(\theta) d\theta \quad \text{(Formula 6a)}$$
$$= Y \sum_{i=1}^{n} \frac{1}{\gamma_i} \{p_i \sinh(\gamma_i \theta) + q_i \cosh(\gamma_i \theta)\} u_1$$

or, $$I(\theta) = -Z^{-1} \sum_{i=1}^{n} \gamma_i \{p_i \sinh(\gamma_i \theta) + q_i \cosh(\gamma_i \theta)\} d\theta \quad \text{(Formula 6b)}$$

wherein said arithmetic operation section comprises a computer, and wherein the method comprises:

setting up linearly simultaneous differential equations as represented in a following formula 10 regarding electromagnetic interaction of said each line segment with the voltage V(θ) and current I(θ) of said each line segment virtually and arbitrarily divided in said transmission line to be analyzed as unknown variables (in the formula 10, W(θ) matrix containing $V(\theta)_{n\times 1}$ and $I(\theta)_{n\times 1}$ as represented in a following formula 11, A is a matrix as represented in a following formula 12 containing the impedance matrix Z created based on said distributed parameters as represented in the formula 3 and the admittance matrix Y created based on said distributed parameters as represented in the formula 4), and solving said linearly simultaneous differential equations as represented in the formula 10 by obtaining 2n eigenvalues $\gamma_i$ (i=1 to 2n) of said matrix A from a distributed self-inductance $L_i$, a distributed resistance $R_i$, and a distributed capacitance $c_i$ and a distributed conductance $g_i$ in relation to a reference potential plane in said transmission line, and a distributed mutual inductance $M_{ij}$, a distributed capacitance $C_{ij}$, and a distributed conductance $G_{ij}$ between said transmission line and another transmission line, which are input from said input section, thereby acquiring a general solution ($\alpha_i$ (i=1 to 2n) are arbitrary constants, and $u_i$ (i=1 to 2n) are eigenvectors corresponding to said eigenvalues $\gamma_i$) of voltage and current as represented in a following formula 13

$$\frac{d}{d\theta} W(\theta) = A \cdot W(\theta) \quad \text{(Formula 10)}$$

$$W(\theta) = \begin{pmatrix} V(\theta)_{n\times 1} \\ I(\theta)_{n\times 1} \end{pmatrix} = \begin{pmatrix} v_1(\theta) \\ v_2(\theta) \\ \vdots \\ v_n(\theta) \\ i_1(\theta) \\ i_2(\theta) \\ \vdots \\ i_n(\theta) \end{pmatrix} \quad \text{(Formula 11)}$$

$$A = \begin{pmatrix} 0_{n\times n} & -Z \\ Y & 0_{n\times n} \end{pmatrix}_{2n \times 2n} \quad \text{(Formula 12)}$$

$$W(\theta) = \sum_{i=1}^{2n} \alpha_i e^{\gamma_i \theta} u_i. \quad \text{(Formula 13)}$$

18. The computer-readable medium according to claim 17, wherein said computer sets up 2n simultaneous equations under boundary conditions of said each line segment input from said input section for each of the j-th (j=1 to n) components of a voltage vector as represented in a following formula 14 and a current vector as represented in a following formula 15 in the transmission line, which are derived from the general solution as represented in the formula 13, thereby acquiring 2n arbitrary constants (unknown variables) $\alpha_i$ $$v_j(\theta) = \sum_{i=1}^{2n} \alpha_i e^{\gamma_i \theta} u_{ji} \quad \text{(Formula 14)}$$

$$i_j(\theta) = \sum_{i=1}^{2n} \alpha_i e^{\gamma_i \theta} u_{n+ji}. \quad \text{(Formula 15)}$$

* * * * *